United States Patent
Kim et al.

(10) Patent No.: US 9,164,889 B2
(45) Date of Patent: Oct. 20, 2015

(54) MEMORY SYSTEM TO SELECT PROGRAM OPERATION METHOD AND METHOD THEREOF

(71) Applicant: SAMSUNG Electronics Co., Ltd., Suwon-si, Gyeonggi-do (KR)

(72) Inventors: Seung-Bum Kim, Hwaseong-si (KR); Jaeyong Jeong, Yongin-si (KR); Kitae Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 165 days.

(21) Appl. No.: 13/755,144

(22) Filed: Jan. 31, 2013

(65) Prior Publication Data

US 2013/0219109 A1    Aug. 22, 2013

(30) Foreign Application Priority Data

Feb. 22, 2012    (KR) .................. 10-2012-0017986

(51) Int. Cl.
| | |
|---|---|
| G06F 12/00 | (2006.01) |
| G06F 12/02 | (2006.01) |
| G11C 11/56 | (2006.01) |
| G11C 7/10 | (2006.01) |
| G11C 16/10 | (2006.01) |
| G06F 11/10 | (2006.01) |

(52) U.S. Cl.
CPC ........ G06F 12/0246 (2013.01); G06F 11/1068 (2013.01); G11C 7/1006 (2013.01); G11C 11/5628 (2013.01); G11C 16/10 (2013.01)

(58) Field of Classification Search
CPC .................. G06F 12/02; G11C 16/00
USPC ............................................. 711/103
See application file for complete search history.

(56) References Cited

U.S. PATENT DOCUMENTS

| | | | |
|---|---|---|---|
| 6,858,906 B2 | 2/2005 | Lee et al. | |
| 7,310,271 B2 | 12/2007 | Lee | |
| 7,385,850 B2 | 6/2008 | Jeong et al. | |
| 7,477,550 B2 | 1/2009 | Son et al. | |
| 7,529,124 B2 | 5/2009 | Cho et al. | |
| 7,755,950 B2 * | 7/2010 | Yu et al. .................. | 365/185.28 |
| 8,014,196 B2 | 9/2011 | Graef | |
| 2004/0169238 A1 | 9/2004 | Lee et al. | |
| 2005/0174841 A1 | 8/2005 | Ho | |
| 2006/0180851 A1 | 8/2006 | Lee et al. | |
| 2009/0248952 A1 * | 10/2009 | Radke et al. .................. | 711/100 |
| 2009/0310412 A1 | 12/2009 | Jang et al. | |
| 2009/0327591 A1 | 12/2009 | Moshayedi | |
| 2010/0088574 A1 | 4/2010 | Kim et al. | |
| 2011/0125955 A1 | 5/2011 | Chen | |
| 2011/0141811 A1 * | 6/2011 | Shimizu et al. .......... | 365/185.03 |

* cited by examiner

*Primary Examiner* — Reginald Bragdon
*Assistant Examiner* — Edward Wang
(74) *Attorney, Agent, or Firm* — Ellsworth IP Group PLLC

(57) ABSTRACT

A memory system includes a nonvolatile memory device having a first data area storing M-bit data using a buffer program operation and a second data area storing N-bit data (N being an integer larger than M) using a main program operation and a memory controller configured to control the nonvolatile memory device. When a main program operation using data stored at the first and second data areas is required, the memory controller calculates values indicating a performance of the required main program operation to be executed according to a plurality of main program manners, selects one of the plurality of main program manners based on the calculated values, and controls the nonvolatile memory device to perform the required main program operation according to the selected main program manner.

14 Claims, 21 Drawing Sheets

MEMORY SYSTEM TO SELECT PROGRAM OPERATION METHOD AND METHOD THEREOF

CROSS-REFERENCE TO RELATED APPLICATIONS

This application claims priority under 35 U.S.C. §119 from Korean Patent Application No. 10-2012-0017986 filed Feb. 22, 2012, in the Korean Intellectual Property Office, the entire contents of which are hereby incorporated by reference.

BACKGROUND

1. Field

The inventive concepts described herein relate to a memory system including a multi-bit memory device storing multi-bit data and a method thereof.

2. Description of the Related Art

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices, such as random access memory (RAM) devices, and nonvolatile memory devices. In RAM devices, data is stored by either establishing the logic state of a bistable flip-flop such as in a static random access memory (SRAM), or by charging a capacitor in a dynamic random access memory (DRAM). In both SRAM and DRAM devices, data remains stored and may be read as long as the power is applied, but data is lost when the power is turned off.

Mask Read-Only Memory (MROM), Programmable Read-Only Memory (PROM), Erasable Programmable Read-Only Memory (EPROM), and Electrically Erasable Programmable Read-Only Memory (EEPROM) devices are capable of storing the data, even with the power turned off. The non-volatile memory data storage state may be permanent or reprogrammable, depending upon the fabrication technology used. Nonvolatile semiconductor memories are used to store program and microcode storage in a wide variety of applications in the computer, avionics, telecommunications, and consumer electronics industries. A combination of single-chip volatile as well as nonvolatile memory storage modes is also available in devices such as nonvolatile SRAM (nvRAM) for use in systems that require fast, reprogrammable nonvolatile memory. In addition, dozens of special memory architectures have evolved which contain some additional logic circuitry to optimize their performance for application-specific tasks.

Mask Read-Only Memory (MROM), Programmable Read-Only Memory (PROM) and Erasable Programmable Read-Only Memory (EPROM) nonvolatile memory devices are not free to erase and write by system itself, so it is not easy to update the contents of the memory. On the other hand, Electrically Erasable Programmable Read-Only Memory (EEPROM) nonvolatile memory devices are electrically erasable and writable, and may, thus, be readily applied to auxiliary memories or system programming memories that require continuous update.

SUMMARY OF THE INVENTION

The present general inventive concept provides a memory system to store multi-bit data in a memory device, and a method thereof.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a memory system including a nonvolatile memory device having a first data area to store M-bit data using a buffer program operation and a second data area to store N-bit data (N being an integer larger than an integer M) using a main program operation, and a memory controller configured to control the nonvolatile memory device, wherein when the main program operation using data stored at the first and second data areas is required, the memory controller calculates values indicating a performance of the required main program operation to be executed according to a plurality of main program manners, selects one of the plurality of main program manners based on the calculated values, and controls the nonvolatile memory device to perform the required main program operation according to the selected main program manner.

The foregoing and/or other features and utilities of the present general inventive concept may also be achieved by providing an operating method of a memory system which includes a nonvolatile memory device having a first data area to store M-bit data using a buffer program operation and a second data area to store N-bit data (N being an integer larger than an integer M) using a main program operation, and a memory controller configured to control the nonvolatile memory device. The operating method may include determining whether a main program operation using data stored at the first and second data areas is required, when the main program operation using data stored at the first and second data areas is required, calculating values indicating a performance of the required main program operation to be executed according to a plurality of main program manners, selecting one of the plurality of main program manners based on the calculated values, and controlling the nonvolatile memory device to perform the required main program operation according to the selected main program manner.

The foregoing and/or other features and utilities of the present general inventive concept may also be achieved by providing a computer-readable medium to contain computer-readable medium to execute a method of controlling a nonvolatile memory device.

The foregoing and/or other features and utilities of the present general inventive concept may also be achieved by providing a memory system including a nonvolatile memory device having a plurality of data area to store different-bit data, and a memory controller to select one of different program manners according to comparison between the program manners to be suitable to perform a main program using the data stored in the nonvolatile memory device, and to perform the main program operation according to the selected program manner using data stored at the first and second data areas.

The memory controller may compare characteristics of the different-bit data and determines the one program manners.

The memory controller may compare characteristics of the different program manners with respect to characteristics of the different-bit data.

The foregoing and/or other features and utilities of the present general inventive concept may also be achieved by providing a computing system including an interface to communicate with an external device to receive and transmit data, a storage having the above-described memory system, and a controller to control the interface and the storage to process the data.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
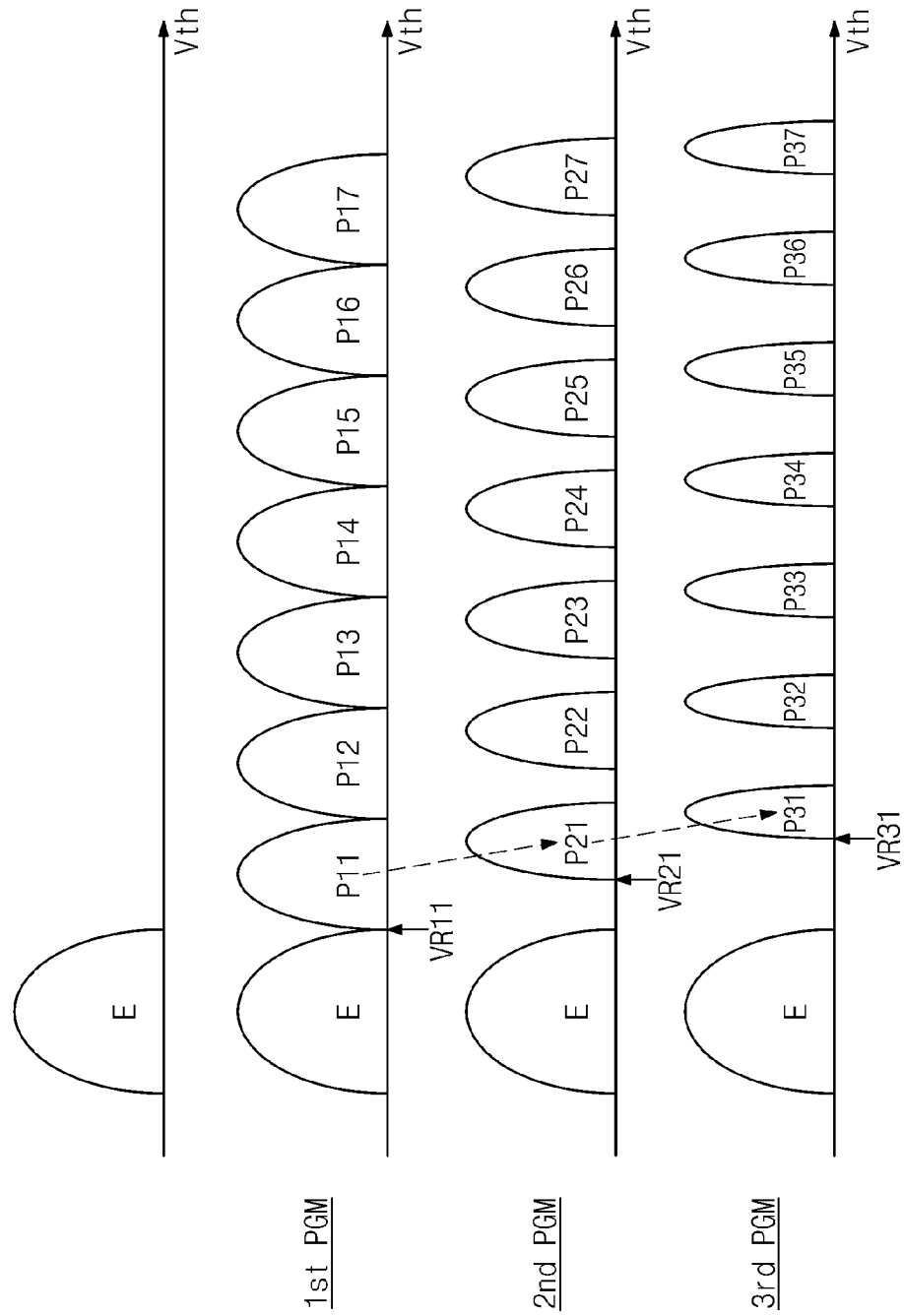
FIG. 1 is a diagram schematically illustrating a program operation executed in a reprogramming manner according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As the number of data bits stored at each memory cell increases (or, as the number of pages (or, page data) corresponding to a word line increases), various programming techniques may have been proposed. For example, an on-chip buffer program method may be applied to a memory system including a multi-bit memory device. It is possible to reduce a size of a buffer memory included in a memory controller of the memory system by using the on-chip buffer program method. The on-chip buffer program method may include programming data temporarily stored at the buffer memory of the memory controller at a first memory area of a multi-bit memory device and programming data stored at the first memory area of the multi-bit memory device at a second memory area of the multi-bit memory device. Programming data temporarily stored at the buffer memory at the first memory area of the multi-bit memory device may be referred to as a buffer program operation, and programming data stored at the first memory area of the multi-bit memory device at the second memory area of the multi-bit memory device may be referred to as a main program operation. That is, the on-chip buffer program method may include a buffer program operation and a main program operation. The multi-bit memory device may further comprise other memory areas other than the first and second memory areas.

In example embodiments, the buffer program operation may be performed when data of a minimum program unit of the first memory area is gathered at the buffer memory of the memory controller. The main program operation may be performed when data corresponding to a minimum program unit of the second memory area is gathered at the first memory area of the multi-bit memory device. Herein, data corresponding to the minimum program unit of the first memory area may be a page of data, and data corresponding to the minimum program unit of the second memory area may be plural pages of data. For example, in the event that a cell-per-bit number is 3, data corresponding to the minimum program unit of the second memory area may be 3-page data. It is well understood that the minimum program units of the first and second memory areas are not limited to this disclosure. With the above description, data of the buffer memory may be programmed at the first memory area of the multi-bit memory device whenever data corresponding to the minimum program unit of the first memory area is gathered at the buffer memory. Thus, it is possible to reduce a size of the buffer memory.

In a memory system adopting the on-chip buffer program method, the main program operation may be performed using various programming manners. For example, the main program operation may be carried out according to a reprogramming manner. Below, the main program operation using the reprogramming manner will be more fully described with reference to FIG. 1.

FIG. 1 is a diagram schematically illustrating a program operation executed in a reprogramming manner according to an exemplary embodiment of the inventive concept. Although FIG. 1 illustrates an example that 3-bit data (or, 3-page data) is programmed according to a reprogramming manner, the present general inventive concept is not limited thereto. That is, the reprogramming manner is not limited to 3-bit data. It is possible that the reprogramming manner may include a number of programming processes, for example, first programming, second programming, and third programming, which will be more fully described.

At the first programming, respective memory cells may be programmed to one, corresponding to 3-bit data, from among eight states E and P11 to P17 from an erase state E. Herein, the eight states E and P11 to P17, as illustrated in FIG. 1, may be distributed adjacent to one another without a read margin. That is, 3-bit data may be roughly programmed at the first programming. 3-bit data may be data programmed at a first memory area via a buffer program operation, and may be read from the first memory area at the first programming.

In the exemplary embodiment, the first programming may be performed in an incremental step pulse programming (ISPP) manner in which a program voltage is increased by an increment at iteration of program loops.

In the exemplary embodiment, the first programming may include a verification operation. At the verification operation, at least one program state may be verified. For example, at the first programming, even program states P12, P14, and P16 may be verified, while odd program states P11, P13, and P15, and P17 may not be verified. That is, the first programming may be completed when the even program states P12, P14, and P16 are verify-passed.

The second programming may be carried out to reprogram first programmed states P11 to P17 to denser states P21 to P27. Herein, the states P21 to P27, as illustrated in FIG. 1, may be distributed adjacent to one another to have a predetermined read margin. That is, 3-bit data programmed at the first programming may be reprogrammed at the second programming. As described above, 3-bit data used at the second programming may be equal to that used at the first programming, and may be read from the first memory area. As illustrated in FIG. 1, the first-programmed state P11 may be reprogrammed to a state P21 at the second programming. As a result, a threshold voltage distribution corresponding to the state P21 may become narrower in width than that corresponding to the state P11. In other words, a verification voltage VR21 to verify the second-programmed state P21 may be higher than a verification voltage VR11 to verify the first-programmed state P11.

In the exemplary embodiment, the second programming may be made in the ISPP manner.

In the exemplary embodiment, the second programming may include a verification operation. All program states may be verified at a verification operation of the second programming. That is, the second programming may be completed when all program states P21 to P27 are verify-passed.

The third programming may be carried out to reprogram second programmed states P21 to P27 to denser states P31 to P37. Here, the states P31 to P37, as illustrated in FIG. 1, may be distributed adjacent to one another to have predetermined read margin larger than that of the second programming. That is, 3-bit data programmed at the second programming may be reprogrammed at the third programming. As described above, 3-bit data used at the third programming may be equal to that used at the first/second programming, and may be read from the first memory area. As the third programming is executed, the second-programmed state P21 may be reprogrammed to a state P31 at the third programming. As a result, a threshold voltage distribution corresponding to the third-programmed state P31 may be narrower in width than that corresponding to the second-programmed state P21. In other words, a verification voltage VR31 to verify the third-programmed state P31 may be higher than a verification voltage VR21 to verify the second-programmed state P21.

In the exemplary embodiment, the third programming may be made in the ISPP manner.

In the exemplary embodiment, all program states may be verified at a verification operation of the third programming. That is, the third programming may be completed when all program states P31 to P37 are verify-passed.

The inventive concept need not be limited to an example that 3-bit data is programmed at the first programming. The inventive concept is applicable to an example that 2-bit data is programmed at the first programming. After 2-bit data is first programmed, second programming may be executed to program 3-bit data. A 3-bit program operation illustrated in FIG. 1 may be performed in a 3-step reprogramming manner. However, the inventive concept is not limited thereto. In the inventive concept, a program operation executed in a reprogramming manner may include three programming operations executed to narrow a threshold voltage distribution corresponding to a data value to be stored (or, to finely form a threshold voltage distribution).

As described above, each programming may include setting up a page buffer with data to be programmed (e.g., 3-page data). This operation may be referred to as a data setup operation. That is, each programming may accompany a data setup operation.

Figure 2:
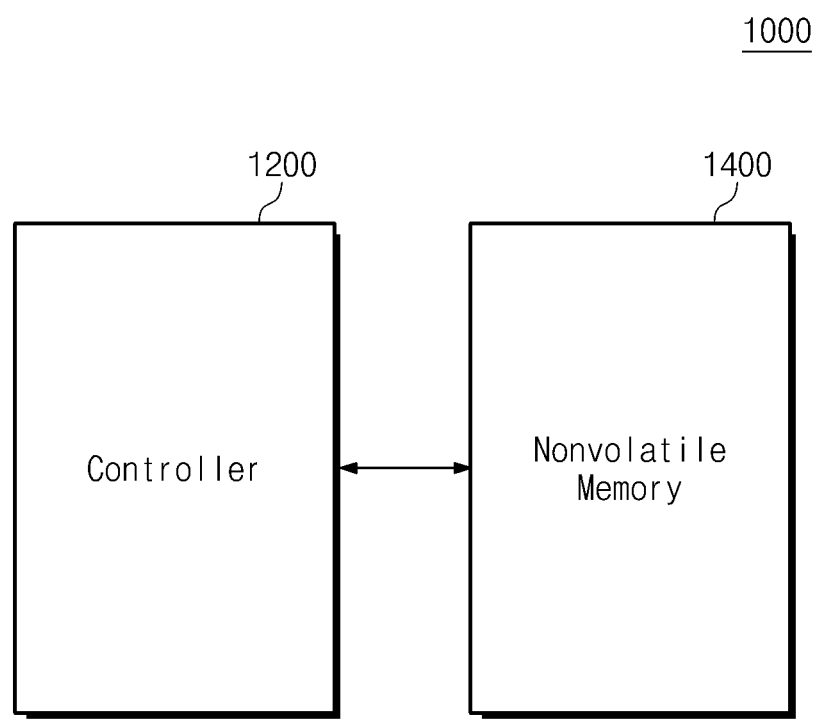
FIG. 2 is a block diagram schematically illustrating a memory system according to an embodiment of the inventive concept.

FIG. 2 is a block diagram schematically illustrating a memory system 1000 according to an exemplary embodiment of the inventive concept.

Referring to FIG. 2, the memory system 1000 according to an embodiment of the inventive concept may include a memory controller 1200 and a nonvolatile memory device 1400 as a multi-bit memory device. The memory controller 1200 may be configured to control the nonvolatile memory device 1400 according to an external request (e.g., a write request, a read request, etc. The memory controller 1200 may be configured to control the nonvolatile memory device 1400 according to an internal request (e.g., an operation associated with a sudden power-off, background operations such as merge, garbage collection, etc.) without an external request. The nonvolatile memory device 1400 may operate responsive to the control of the memory controller 1200, and may be used as a type of a storage medium to store data information. The storage medium may be formed of one or more memory chips. The nonvolatile memory device 1400 may communicate with the memory controller 1200 via one or more channels. The nonvolatile memory device 1400 may include a NAND flash memory device, for example.

When a main program operation is required, the memory controller 1200 may select one of a plurality of reprogramming manners to control the nonvolatile memory device 1400 according to the selected reprogramming manner. A reprogramming manner may be selected according to various references. For example, a reprogramming manner may be decided according to a time taken to perform a 3-step reprogramming operation. Alternatively, a reprogramming manner may be decided according to a power consumed to perform a 3-step reprogramming operation. Alternatively, a reprogramming manner may be decided according to a data transfer number between the memory controller 1200 and the nonvolatile memory device 1400 when the 3-step reprogramming operation is performed. However, it is well understood that a reference for deciding the reprogramming manner is not limited to this disclosure.

Figure 3:
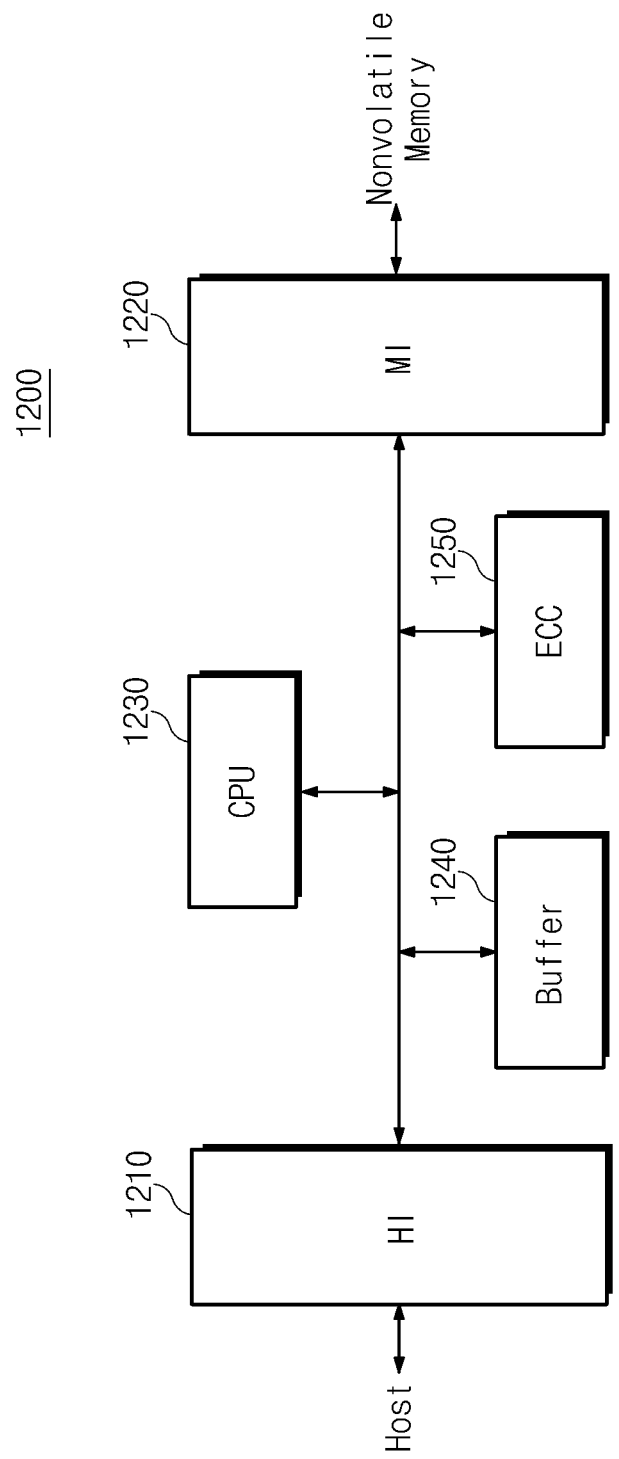
FIG. 3 is a block diagram schematically illustrating a memory controller of the memory system of FIG. 2.

FIG. 3 is a block diagram schematically illustrating the memory controller 1200 of the memory system 1000 of FIG. 2. Referring to FIGS. 2 and 3, the memory controller 1200 may include a host interface 1210 as a first interface, a memory interface 1220 as a second interface, a CPU 1230, a buffer memory 1240, and an error detecting and correcting circuit (ECC) 1250.

The host interface 1210 may be configured to interface with an external device (for example, a host), and the memory interface 1220 may be configured to interface with the nonvolatile memory device 1400 of FIG. 2. The CPU 1230 may be configured to control an overall operation of the controller 1200. The CPU 1230 may be configured to operate firmware, such as flash translation layer (FTL), for example. The buffer memory 1240 may be used to temporarily store data transferred from an external device via the host interface 1210 or data transferred from the nonvolatile memory device 1400 via the memory interface 1220. The ECC 1250 may be configured to encode data to be stored in the nonvolatile memory device 1400 and to decode data read out from the nonvolatile memory device 1400.

Although not illustrated in figures, the memory controller 1200 may further include a randomizer/de-randomizer which is configured to randomize data to be stored in the nonvolatile memory device 1400 and to de-randomize data read from the nonvolatile memory device 1400. An example of the randomizer/de-randomizer is disclosed in U.S. Patent Application Publication No. 2010/0088574, the entirety of which is incorporated by reference herein.

In the exemplary embodiment, the host interface 1210 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, and the like. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and the like.

Figure 4:
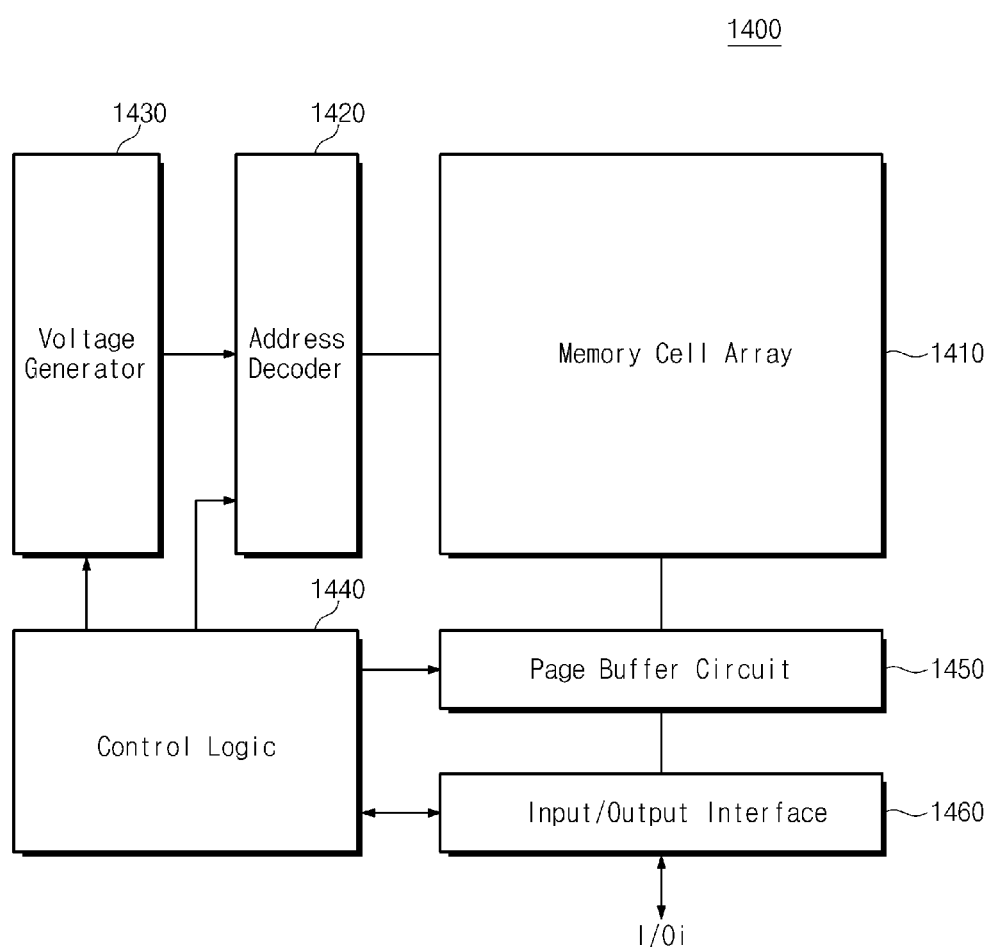
FIG. 4 is a block diagram schematically illustrating a nonvolatile memory device of the memory system of FIG. 2.

FIG. 4 is a block diagram schematically illustrating the nonvolatile memory device 1400 of the memory system 1000 of FIG. 2.

The nonvolatile memory device 1400 may be a NAND flash memory device, for example. However, the nonvolatile memory device 1400 is not limited to the NAND flash memory device. For example, the inventive concept may be applied to a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like. Further, the nonvolatile memory device 1400 can be implemented to have a three-dimensional array structure. A nonvolatile memory device with the three-dimensional array structure may be referred to as a vertical NAND flash memory device. The inventive concept may be applied to a Charge Trap Flash (CTF) memory device including a charge storage layer formed of an insulation film as well as a flash memory device including a charge storage layer formed of a conductive floating gate.

Referring to FIG. 4, the nonvolatile memory device 1400 may include a memory cell array 1410, an address decoder 1420, a voltage generator 1430, control logic 1440, a page buffer circuit 14500, and an input/output interface 1460.

The memory cell array 1410 may include memory cells arranged at intersections of rows (e.g., word lines) and columns (e.g., bit lines). Each memory cell may store 1-bit data or multi-bit data (M being an integer of 2 or more). The address decoder 1420 may be controlled by the control logic 1440, and may perform selecting and driving operations on rows (e.g., word lines, a string selection line(s), a ground selection line(s), a common source line, etc.) of the memory cell array 1410. The voltage generator 1430 may be controlled by the control logic 1440, and may generate voltages required for each operation such as a high voltage, a program voltage, a read voltage, a verification voltage, an erase voltage, a pass voltage, a bulk voltage, and the like. Voltages generated by the voltage generator 1430 may be provided to the memory cell array 1410 via the address decoder 1420. The control logic 1440 may be configured to control an overall operation of the nonvolatile memory device 1400.

The page buffer circuit 1450 may be controlled by the control logic 1440, and may be configured to read data from the memory cell array 1410 and to drive columns (e.g., bit lines) of the memory cell array 1410 according to program data. The page buffer circuit 1450 may include page buffers respectively corresponding to bit lines or bit line pairs. Each of the page buffers may include a plurality of latches. The input/output interface 1460 may be controlled by the control logic 1440, and may interface with an external device (e.g., the memory controller 1200 of FIG. 2). Although not illustrated in FIG. 4, the input/output interface 1460 may include a column decoder configured to select page buffers of the page buffer circuit 1450 by a predetermined unit, an input buffer receiving data, an output buffer outputting data, and the like.

Figure 5:
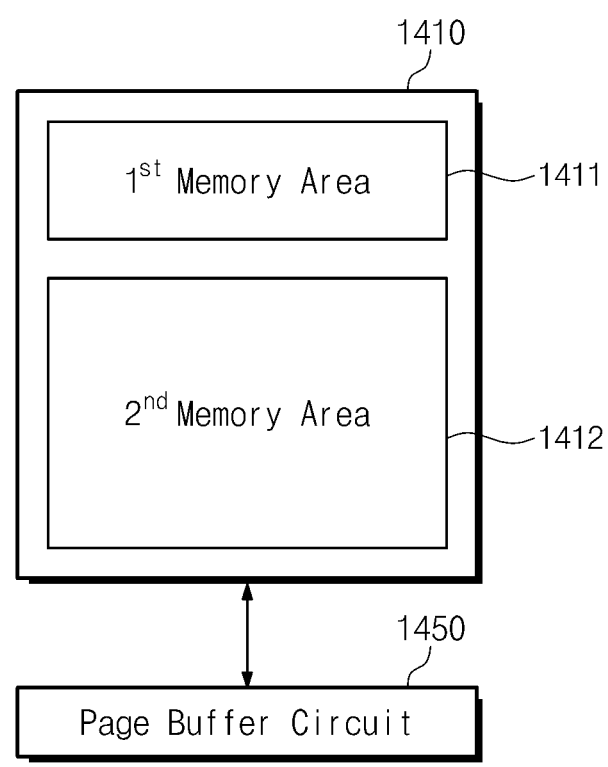
FIG. 5 is a block diagram schematically illustrating a memory cell array of the nonvolatile memory device of FIG. 4.

FIG. 5 is a block diagram schematically illustrating the memory cell array 1410 of the nonvolatile memory device 1400 of FIG. 4.

Referring to FIGS. 4 and 5, the memory cell array 1410 may include a plurality of memory blocks, which is divided into a first memory area 1411 and a second memory area 1412. Here, division of the first and second memory areas 1411 and 1412 is made logically, not physically. Division of the first and second memory areas 1411 and 1412 can be changed logically. In other words, physical sizes of the first and second memory areas 1411 and 1412 can be changed logically, for example, under the control of the memory controller 1200 of FIGS. 2 and 3. Memory blocks in the first memory area 1411 may be programmed in a manner different from memory blocks in the second memory area 1412. For example, memory blocks in the first memory area 1411 may be programmed according to a single-bit program manner (hereinafter, referred to as a single-level cell (SLC) program manner), and memory blocks in the second memory area 1412 may be programmed according to a multi-bit program manner (hereinafter, referred to as a multi-level cell/triple-level cell (MLC/TLC) program manner) (e.g., the above-described 3-step reprogramming manner). In other words, each memory cell in the first memory area 1411 may store 1-bit data, while each memory cell in the second memory area 1412 may store M-bit data (M being an integer of 3 or more). As a result, data bits stored in each memory cell in the first memory area 1411 may be less than M-bit data stored in each memory cell in the second memory area 1412.

As described above, data provided from a memory controller 1200 may be programmed at the first memory area 1411 via a buffer program operation. Data for a main program operation may be read out from the first memory area 1411, and the read data may be programmed at the second memory area 1412 via the main program operation. Unlike the case that data for the main program operation is data stored at the first memory area 1411, data for the main program operation may be data stored at the first and second memory areas 1411 and 1412. Alternatively, data for the main program operation may be data stored at the second memory area 1412. The performance of the main program operation (or, the performance of the memory system) may differentiate according to such a manner (i.e., a data setup manner) that a page buffer circuit 1450 is set up with data for the main program operation. Below, main program operations associated with various cases will be described with reference to accompanying drawings.

Figure 6:
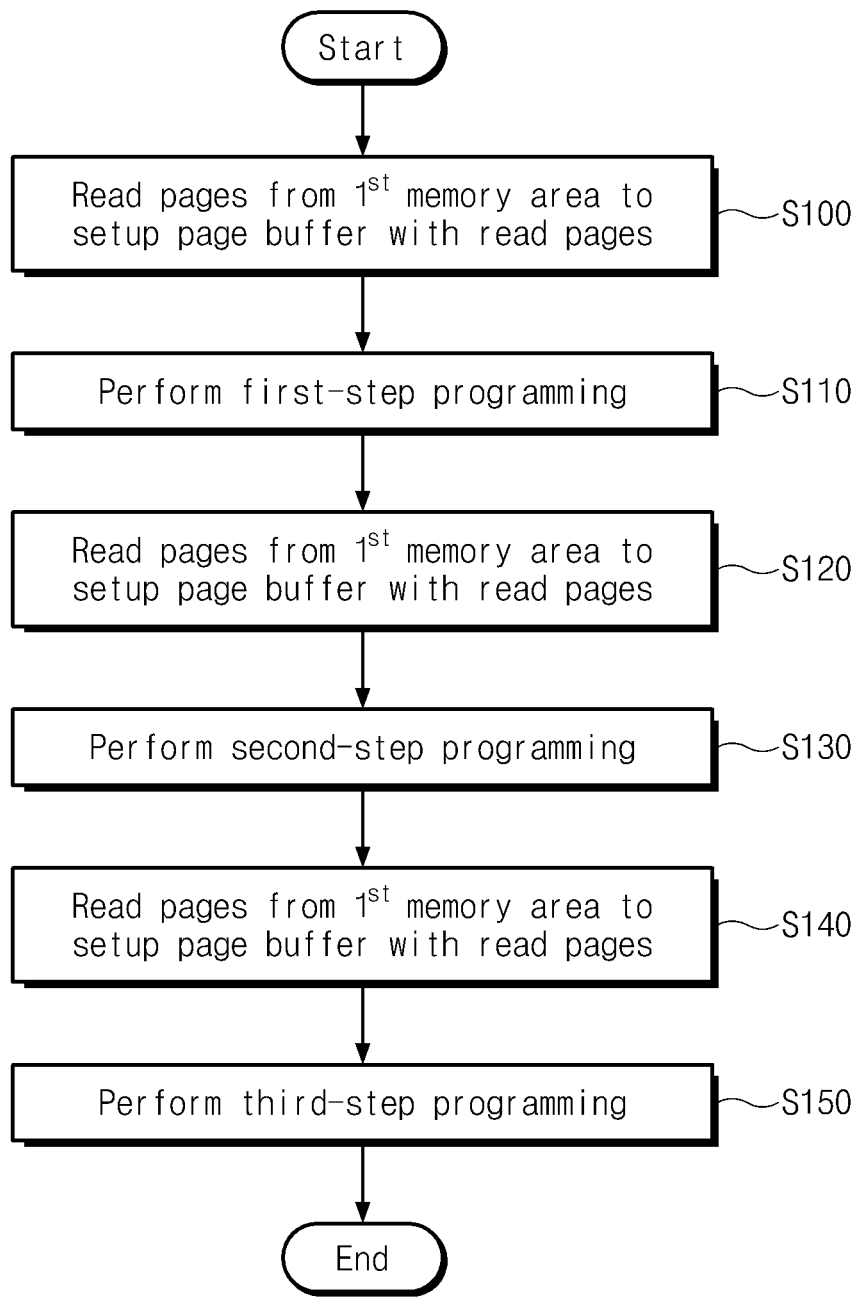
FIG. 6 is a flowchart illustrating a main program operation of a memory system according to an embodiment of the inventive concept.
Figure 7:
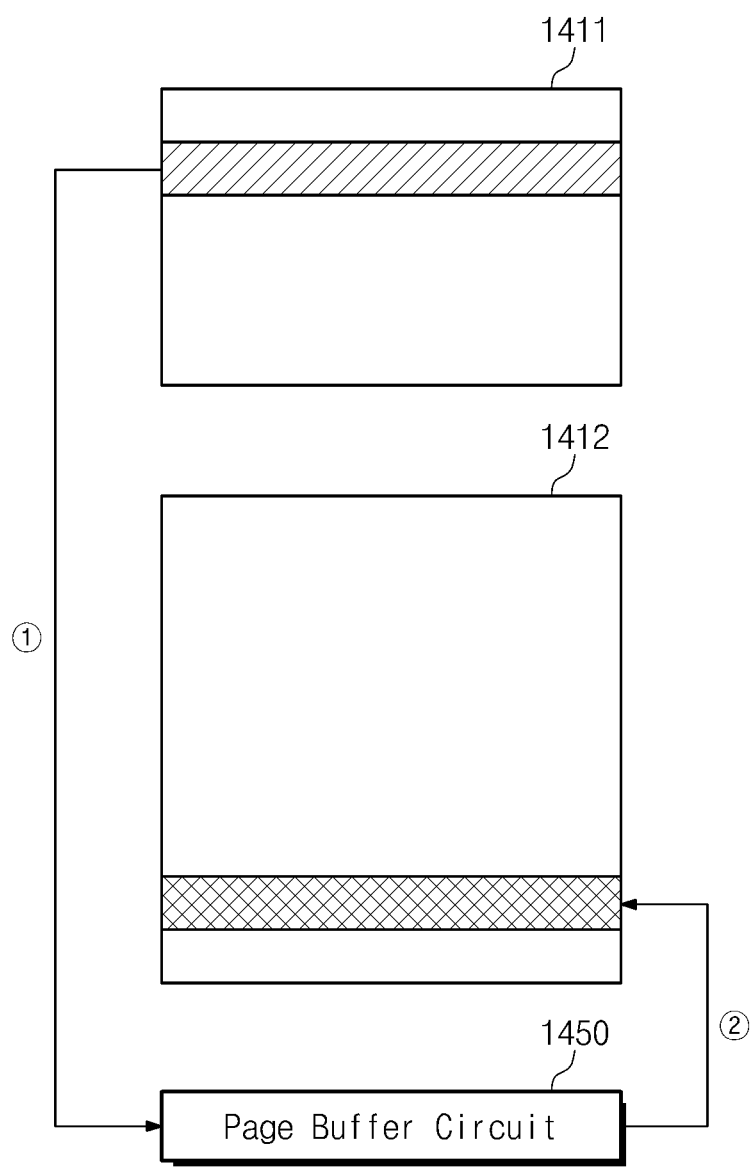
FIG. 7 is a diagram illustrating a data flow according to the main program operation of FIG. 6.

FIG. 6 is a flowchart illustrating a main program operation of a memory system according to an exemplary embodiment of the inventive concept. FIG. 7 is a diagram illustrating a data flow according to the main program operation of FIG. 6.

Whether a main program operation is required may be determined by a memory controller, for example, the memory controller 1200 of FIG. 2. The main program operation may be performed when data to be programmed at a second memory area 1412 is gathered (collected) at a first memory area 1411. Once the main program operation is determined to be required, the memory controller 1200 may control a nonvolatile memory device, for example, the nonvolatile memory device 1400 of FIG. 2, to perform the main program operation.

In operation S100, date to be programmed at the second memory region 1412 may be read out from the first memory area 1411. The data may be 3-page data. This may be performed under the control of the memory controller 1200. The page buffer circuit 1450 of the nonvolatile memory device 1400 may be set up with the read 3-page data. A data setup operation may accompany three SLC read operations, for example. This may be depicted by an arrow ① of FIG. 7. When the page buffer circuit 1450 is set up with the 3-page data, in operation S110, a first programming operation may be executed according to the 3-page data set up at the page buffer circuit 1450. This may be depicted by an arrow ② of FIG. 7. The first programming operation may be made substantially the same as described in FIG. 1, and description thereof is thus omitted.

After the first programming operation is executed, in operation S120, 3-page data for a second programming operation may be read in the same manner as described in operation S100. When the page buffer circuit 1450 is set up with the 3-page data, in operation S130, a second programming operation may be executed according to the 3-page data set up at the page buffer circuit 1450. The second programming operation may be made substantially the same as described in FIG. 1, and description thereof is thus omitted.

After the second programming operation is executed, in operation S140, 3-page data for a third programming operation may be read in the same manner as described in operation S100. When the page buffer circuit 1450 is set up with the 3-page data, in operation S150, a third programming operation may be executed according to the 3-page data set up at the page buffer circuit 1450. The third programming operation may be made substantially the same as described in FIG. 1, and description thereof is thus omitted.

In the exemplary embodiment, an error correcting operation about data read from the first memory area 1411 may not be performed. However, it is well understood that the inventive concept is not limited thereto. That is, an error correcting operation may be executed whenever data is read out from the first memory area. The error correcting operation may be performed by the memory controller 1200. In this case, the error correcting operation may include transferring the read data to the memory controller 1200 and transferring error-corrected data to the nonvolatile memory device 1400.

Figure 8:
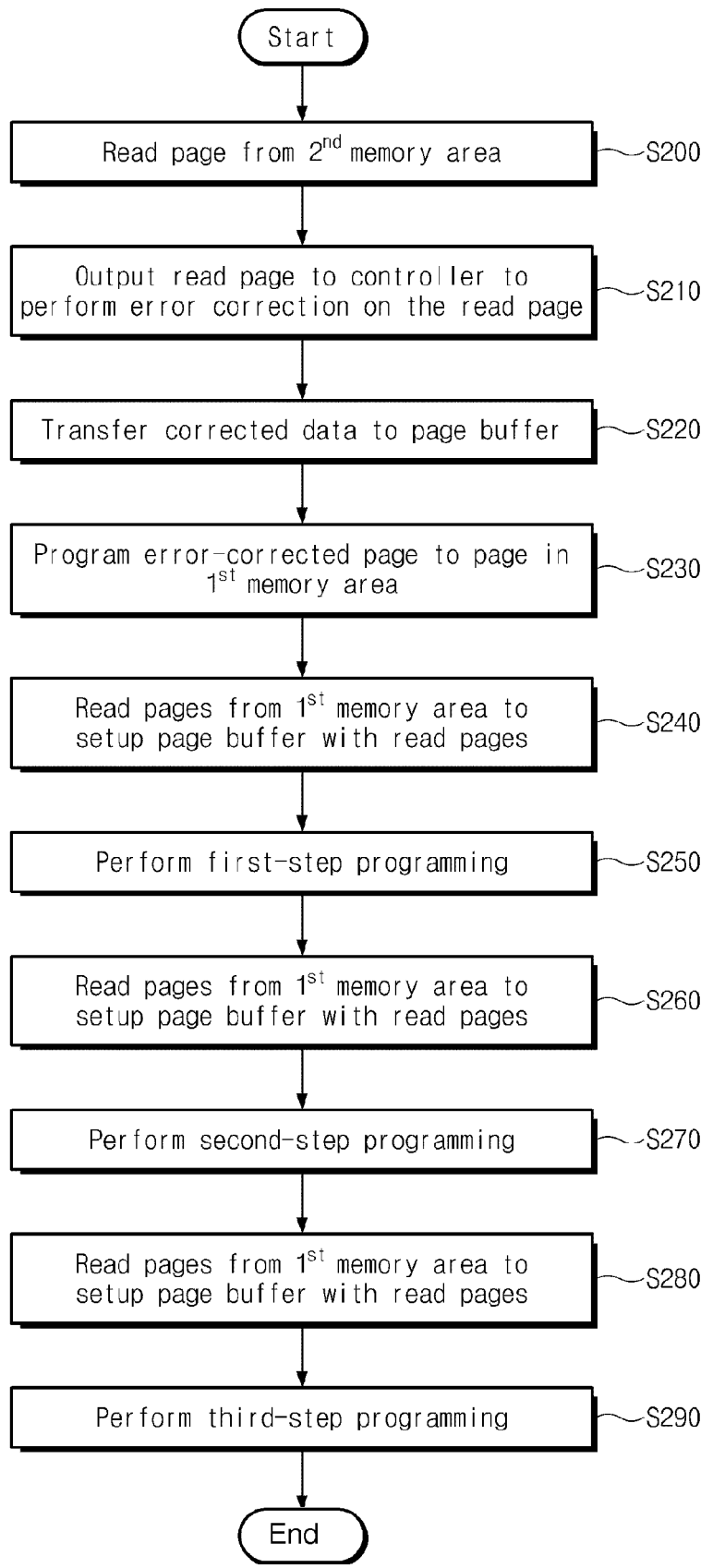
FIG. 8 is a flowchart illustrating a main program operation of a memory system according to another embodiment of the inventive concept.
Figure 9:
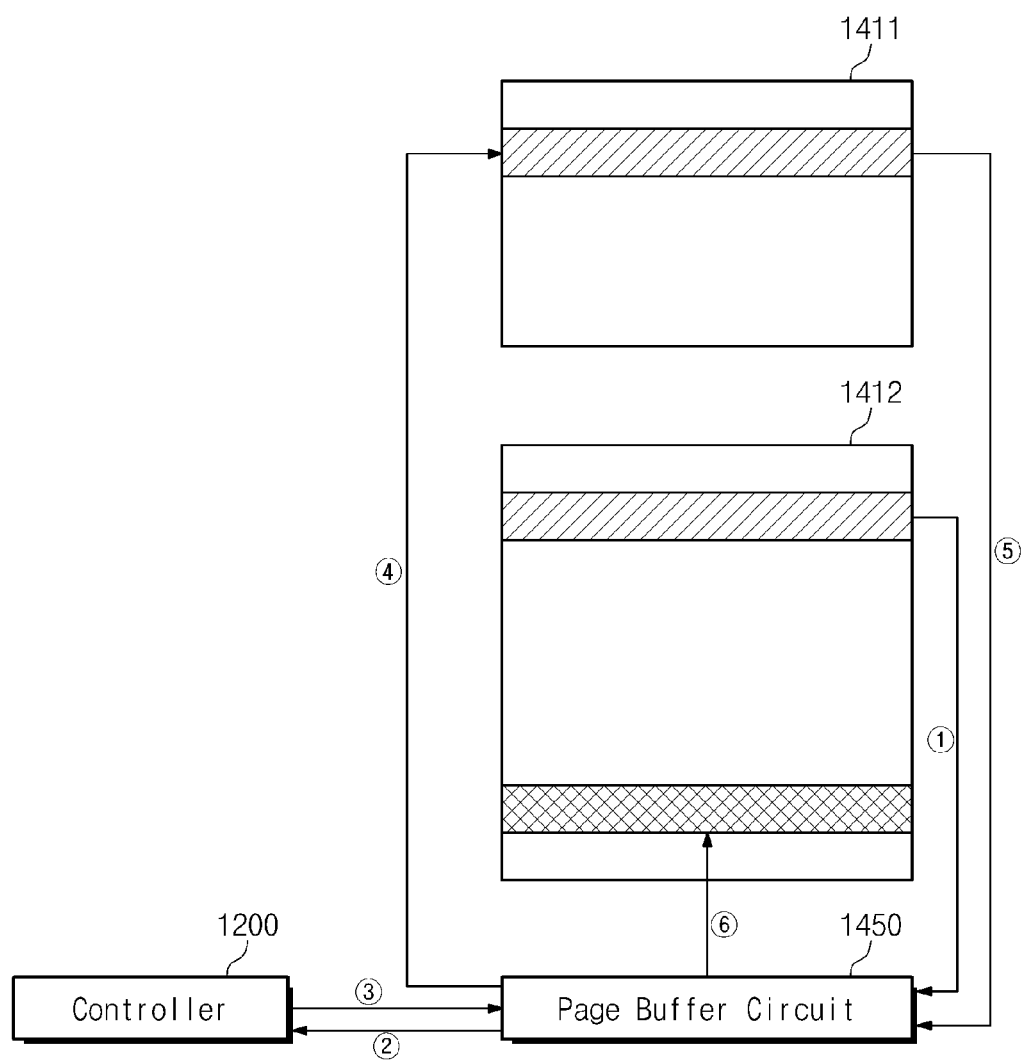
FIG. 9 is a diagram illustrating a data flow according to the main program operation of FIG. 9.

FIG. 8 is a flowchart illustrating a main program operation of a memory system according to an exemplary embodiment of the inventive concept. FIG. 9 is a diagram illustrating a data flow according to the main program operation of FIG. 8.

Data for a main program operation may be formed of data stored in different memory areas, that is, data stored at the first memory area 1411 and data stored at the second memory area 1412. For example, 3-page data for the main program operation may include 2-page data stored at the first memory area 1411 and 1-page data stored at the second memory area 1412. This condition may be determined by a memory controller, such as the memory controller 1200 of FIG. 2.

Referring to FIGS. 3, 4, and 8, in operation S200, the page buffer circuit 1450 may read 1-page data from the second memory area 1412. This may be performed under the control of the memory controller 1200. The 1-page data read from the second memory area 1412 may be stored at latched, designated by the memory controller 1200, from among latches of the page buffer circuit 1450. That is, the page buffer circuit 1450 may be set up with the 1-page data read out from the second memory area 1412. Designation of latches may be made by the memory controller 1200 using an address, a command, or the like. A process of reading 1-page data from the second memory area 1412 may be depicted by an arrow ① in FIG. 9.

In operation S210, the read page data may be output to the memory controller 1200 for error correction as illustrated by an arrow ② in FIG. 9. An ECC 1250 of the memory controller 1200 may perform an error correcting operation about the page data output from the nonvolatile memory device 1400. In operation S220, error-corrected data may be transferred to the page buffer circuit 1450 of the nonvolatile memory device 1400 as illustrated by an arrow ③ in FIG. 9. Error-corrected data may be transferred instead of the whole page data. In operation S230, error-corrected page data may be programmed at the first memory area 1411 as illustrated by an arrow ④ in FIG. 9.

In operation S240, 3-page data to be programmed at the second memory region 1412 may be read out from the first memory area 1411. This may be performed under the control of the memory controller 1200. As described above, 3-page data to be programmed at the second memory area 1412 may be formed of 1-page data programmed at the first memory area 1411 via the above-described process and 2-page data stored at the first memory area 1411.

The page buffer circuit 1450 of the nonvolatile memory device 1400 may be set up with the read 3-page data. A data setup operation may accompany three SLC read operations, for example. This may be depicted by an arrow ⑤ in FIG. 9. When the page buffer circuit 1450 is set up with the 3-page data, in operation S250, a first programming operation may be executed according to the 3-page data set up at the page buffer circuit 1450. This may be depicted by an arrow ⑥ in FIG. 9. The first programming operation may be made substantially the same as described in FIG. 1, and description thereof is thus omitted.

After the first programming operation is executed, in operation S260, 3-page data for a second programming operation may be read in the same manner as described in operation S240. When the page buffer circuit 1450 is set up with the 3-page data, in operation S270, a second programming operation may be executed according to the 3-page data set up at the page buffer circuit 1450. This may be depicted by an arrow ⑥ in FIG. 9. The second programming operation may be made substantially the same as described in FIG. 1, and description thereof is thus omitted.

After the second programming operation is executed, in operation S280, 3-page data for a third programming operation may be read in the same manner as described in operation S240. When the page buffer circuit 1450 is set up with the 3-page data, in operation S290, a third programming operation may be executed according to the 3-page data set up at the page buffer circuit 1450. This may be depicted by an arrow ⑥ in FIG. 9. The third programming operation may be made substantially the same as described in FIG. 1, and description thereof is thus omitted.

The main program operation is described under the assumption that 3-page data for the main program operation includes 2-page data stored at the first memory area 1411 and 1-page data stored at the second memory area 1412. However, the inventive concept is not limited thereto. For example, 3-page data for the main program operation may be formed of 1-page data stored at the first memory area 1411 and 2-page data stored at the second memory area 1412. In this case, the above-described operations S200 to S230 may be iterated whenever page data is read from the second memory area 1412. That is, a loop formed of the above-described operations S200 to S230 may be performed a number of times, for example, twice prior to operation S240.

Figure 10:
FIG. 10 is a flowchart illustrating a main program operation of a memory system according to an embodiment of the inventive concept.
Figure 11:
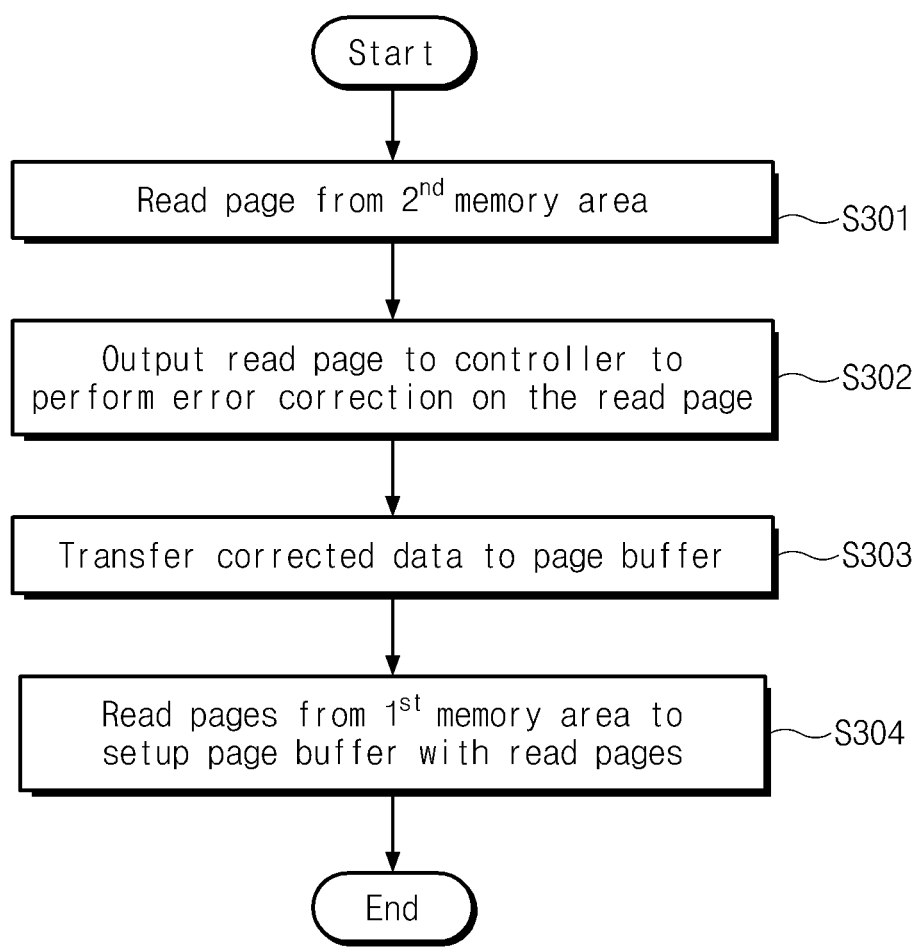
FIG. 11 is a flowchart illustrating a data setup operation of the main program operation of FIG. 10.
Figure 12:
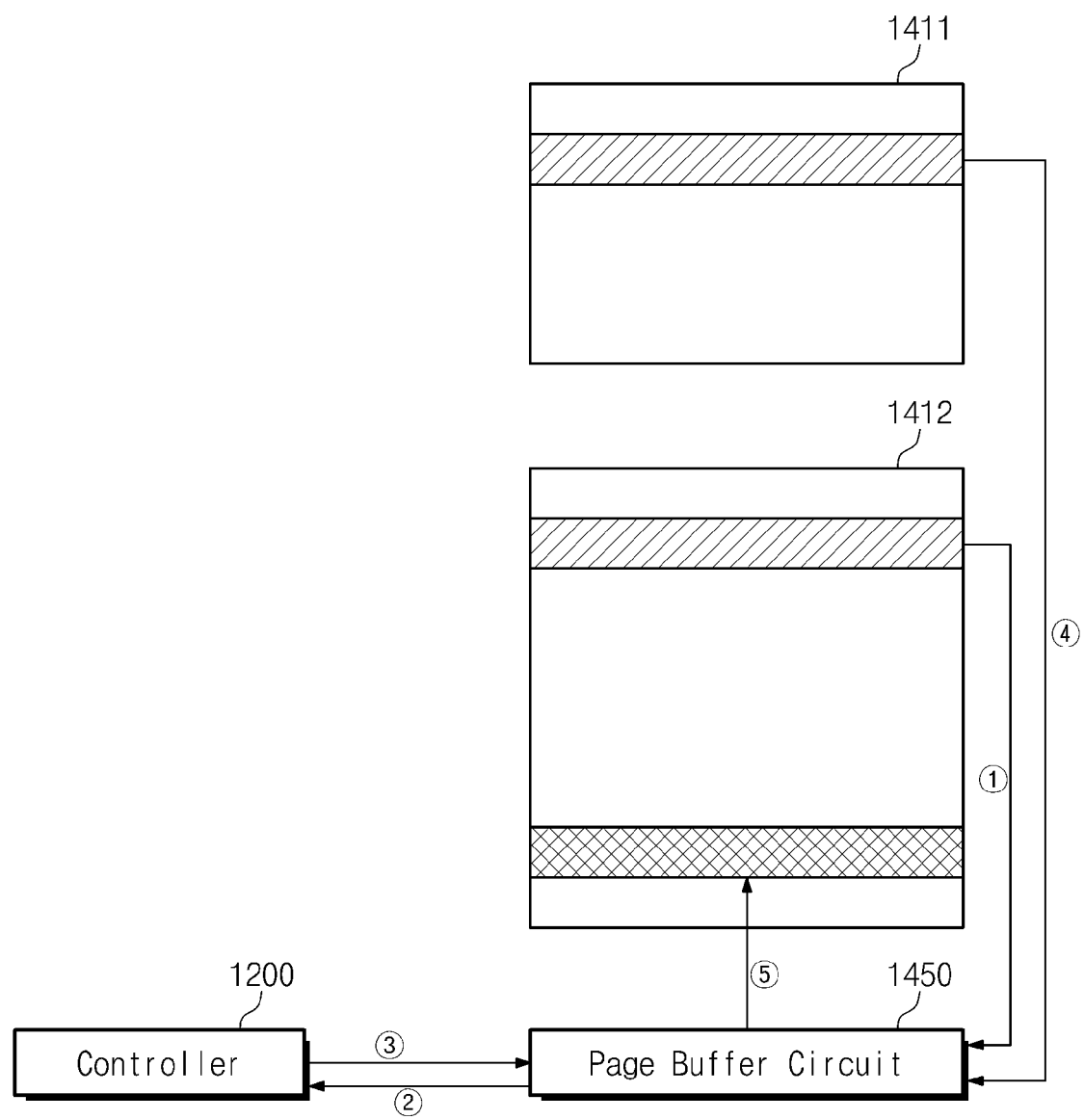
FIG. 12 is a diagram illustrating a data flow according to the main program operation of FIG. 10.

FIG. 10 is a flowchart illustrating a main program operation of a memory system according to still another embodiment of the inventive concept. FIG. 11 is a flowchart illustrating a data setup operation of the main program operation of FIG. 10. FIG. 12 is a diagram illustrating a data flow according to the main program operation of FIG. 10.

Data for a main program operation may be data stored at first and second memory areas 1411 and 1412. For example, it is assumed that 3-page data for the main program operation may be formed of 2-page data stored at the first memory area 1411 and 1-page data stored at the second memory area 1412. This condition may be judged by a memory controller 1200.

Referring to FIGS. 2-4 and 10-12, in operation S300, the page buffer circuit 1450 of the nonvolatile memory device 1400 may be set up with 3-page data for the data setup operation. This may be performed under the control of the memory controller 1200. Referring to FIG. 11 which illustrates the data setup operation executed in operation S300, in operation S301, the page buffer circuit 1450 may read 1-page data from the second memory area 1412 as illustrated by an arrow ① in FIG. 12. This may be performed under the control of the memory controller 1200. The 1-page data read from the second memory area 1412 may be stored at latched, designated by the memory controller 1200, from among latches of the page buffer circuit 1450. That is, the page buffer circuit 1450 may be set up with the 1-page data read out from the second memory area 1412. Designation of latches may be made by the memory controller 1200 using an address, a command, or the like.

In operation S302, the read page data may be output to the memory controller 1200 for error correction as illustrated by an arrow ② in FIG. 12. An ECC 1250 of the memory controller 1200 may perform an error correcting operation about the page data output from the nonvolatile memory device 1400. In operation S303, error-corrected data may be transferred to the page buffer circuit 1450 of the nonvolatile memory device 1400 as illustrated by an arrow ③ in FIG. 9. Error-corrected data may be randomly transferred instead of the whole page data. The page buffer circuit 1450 may be set up with 1-page data of the 3-page data to be programmed at the second memory area 1412 via the above-description operations S301, S302, and S303.

In operation S304, the remaining 2-page data of the 3-page data to be programmed at the second memory area 1412 may be read out from the first memory area 1411 as illustrated by an arrow ④ in FIG. 12. This may be performed under the control of the memory controller 1200. Thus, the page buffer circuit 1450 of the nonvolatile memory device 1400 may be set up with 3-page data: 1-page data read out from the second memory area 1412 and 2-page data read out from the first memory area 1411. A data setup operation may be completed.

When the page buffer circuit 1450 is set up with the 3-page data, in operation S310, a first programming operation may be executed according to the 3-page data set up at the page buffer circuit 1450. This may be depicted by an arrow ⑤ in FIG. 12. The first programming operation may be made substantially the same as described in FIG. 1, and description thereof is thus omitted.

After the first programming operation is executed, in operation S320, the page buffer circuit 1450 may be set up with 3-page data for a second programming operation in the same manner as described in operation S300. When the page buffer circuit 1450 is set up with the 3-page data, in operation S330, a second programming operation may be executed according to the 3-page data set up at the page buffer circuit 1450. The second programming operation may be made substantially the same as described in FIG. 1, and description thereof is thus omitted.

After the second programming operation is executed, in operation S340, the page buffer circuit 1450 may be set up with 3-page data for a third programming operation in the same manner as described in operation S300. When the page buffer circuit 1450 is set up with the 3-page data, in operation S350, a third programming operation may be executed according to the 3-page data set up at the page buffer circuit 1450. The third programming operation may be made substantially the same as described in FIG. 1, and description thereof is thus omitted.

The main program operation is described under the assumption that 3-page data for the main program operation includes 2-page data stored at the first memory area 1411 and 1-page data stored at the second memory area 1412. However, the inventive concept is not limited thereto. For example, 3-page data for the main program operation may be formed of 1-page data stored at the first memory area 1411 and 2-page data stored at the second memory area 1412. In this case, at the data setup operation, a loop formed of the above-described operations S301, S302, and S303 may be performed one or more number of times whenever page data is read from the second memory area 1412, and then the remaining 1-page data may be read out from the first memory area 1411.

In an exemplary embodiment, 3-page data for the main program operation may be data stored at the second memory area 1412. In this case, at the data setup operation, a loop formed of the above-described operations S301, S302, and S303 may be performed one or more number of times whenever page data is read from the second memory area 1412. Afterwards, each programming operation may be performed.

As described with reference to FIGS. 6 to 12, a main program operation may be required at various cases. Times taken to perform main program operations associate with such cases may be different from one another. Herein, a main program manner described with reference to FIG. 6 may be referred to as a normal main program manner, a main program manner described with reference to FIG. 8 may be referred to as a first main program manner, and a main program manner described with reference to FIG. 10 may be referred to as a second main program manner. However, a main program manner may be changed or modified variously. The first and second main program operations may be performed when 3-page data to be programmed at the second memory area 1412 is formed of data stored at the second memory area 1412 as well as data stored at the first memory area 1411. When 3-page data to be programmed at the second memory area 1412 is formed of data stored at the second memory area 1412 as well as data stored at the first memory area 1411, one of the first and second main program manners may be selectively used. This will be more fully described with reference to FIG. 13.

Figure 13:
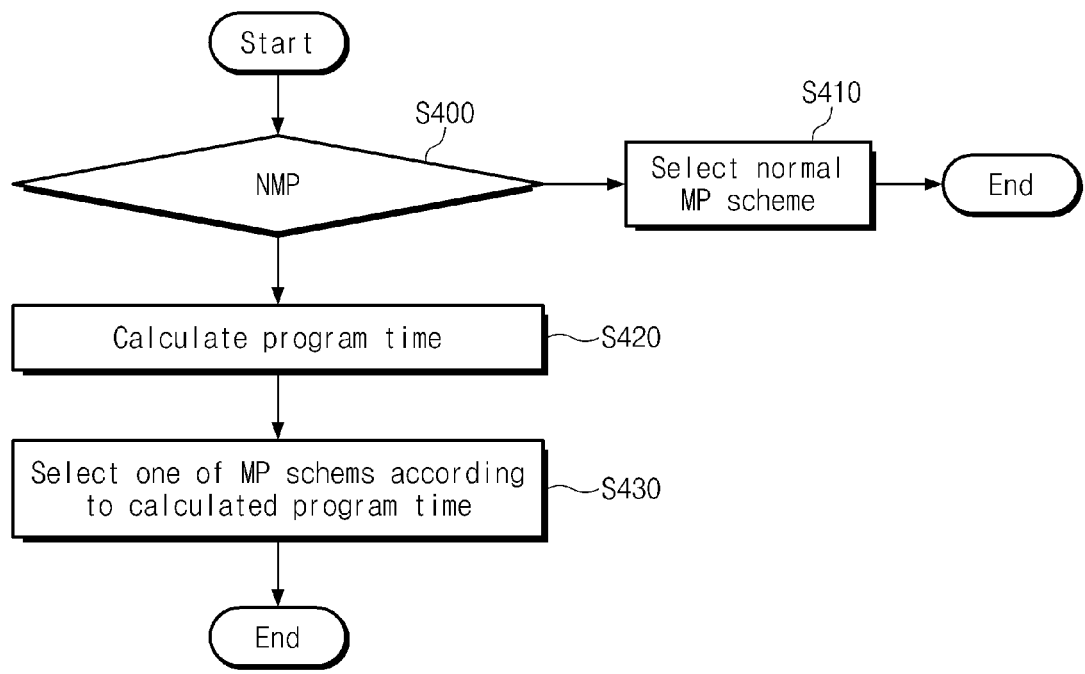
FIG. 13 is a flowchart illustrating an operating method of a memory system according to an embodiment of the inventive concept.

FIG. 13 is a flowchart illustrating an operating method of a memory system according to an embodiment of the inventive concept.

Referring to FIGS. 2-5 and 13, in operation S400, the memory controller 1200 may determine whether a required main program operation is a normal main program operation. If the required main program operation is determined to be the normal main program operation, the method proceeds to operation S410, in which a normal main program manner may be selected. When the normal main program manner is selected, the main program operation may be performed the same as described with reference to FIGS. 6 and 7.

If the required main program operation is judged not to be the normal main program operation, the method proceeds to operation S420, in which a time taken to perform the required main program operation may be calculated. For example, a time taken to perform the required main program operation may be calculated using a table which has times taken to perform each of procedures of a main program operation. A time taken to perform the required main program operation may differentiate according to an input/output frequency, a mat number, configuration of 3-page data to be stored at a second memory area 1412, and the like. In operation S430, a memory controller 1200 may select one of a plurality of main program schemes (e.g., first and second main program manners) based on the calculated time (i.e., a time taken to perform the required main program operation).

In example embodiments, when the calculated time is longer than a reference time, the first main program manner may be selected. If the first main program manner is selected, the main program operation may be performed in the same manner as described with reference to FIGS. 8 and 9. When the calculated time is shorter than the reference time, the second main program manner may be selected. If the second main program manner is selected, the main program operation may be performed in the same manner as described with reference to FIGS. 10 and 11. Herein, the reference time may be decided variously. A time taken (or, a power consumed) to perform a main program operation using the first main program manner may differentiate as occasion demands. Likewise, a time taken (or, a power consumed) to perform a main program operation using the second main program manner may differentiate as occasion demands.

In other example embodiments, the inventive concept is not limited to the case that selection of main program manners is made according to a reference time. For example, a time taken to perform a main program operation using the first main program manner and a time taken to perform a main program operation using the second main program manner may be calculated, and one of the first and second main program manners may be selected according to the calculated times.

Figure 14:
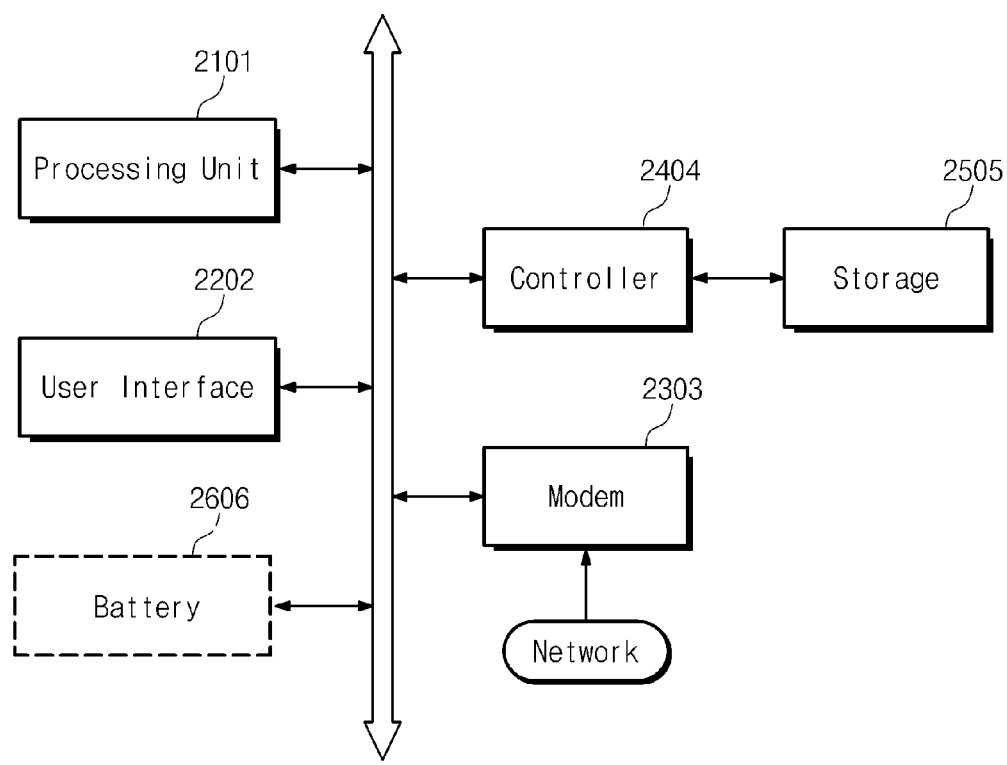
FIG. 14 is a block diagram schematically illustrating a computing system according to an embodiment of the inventive concept.

FIG. 14 is a block diagram schematically illustrating a computing system according to an embodiment of the inventive concept.

The computing system may include a processing unit 2101, a user interface 2202, a network interface, for example, a modem 2303 such as a baseband chipset, a memory controller 2404, and a nonvolatile memory device 2505 as a storage medium. The memory controller 2404 and the nonvolatile memory device 2505 may be substantially equal to those illustrated in FIG. 2. That is, the memory controller 2404 may select one of a plurality of main program manners to control a main program operation of the nonvolatile memory device 2505 according to the selected main program manner. Further, the nonvolatile memory device 2505 may include a page buffer circuit which is configured to be set up with data stored at a second memory area as well as a first memory area. N-bit data (N being 1 or more integer) processed/to be processed by the processing unit 2101 may be stored in the nonvolatile memory device 2505 through the memory controller 2404. In the event that the computing system is a mobile device, a power source, for example, a battery 2606, may be further included in the computing system to supply an operating voltage thereto. The power source may receive a power supply from an external device, store the received power, and/or supply the power received or stored to components of the memory system. Although not illustrated in FIG. 14, the computing system may further comprise an application chipset, a camera image processor (CIS), a mobile DRAM, and the like, to perform functions of the memory system.

Figure 15:
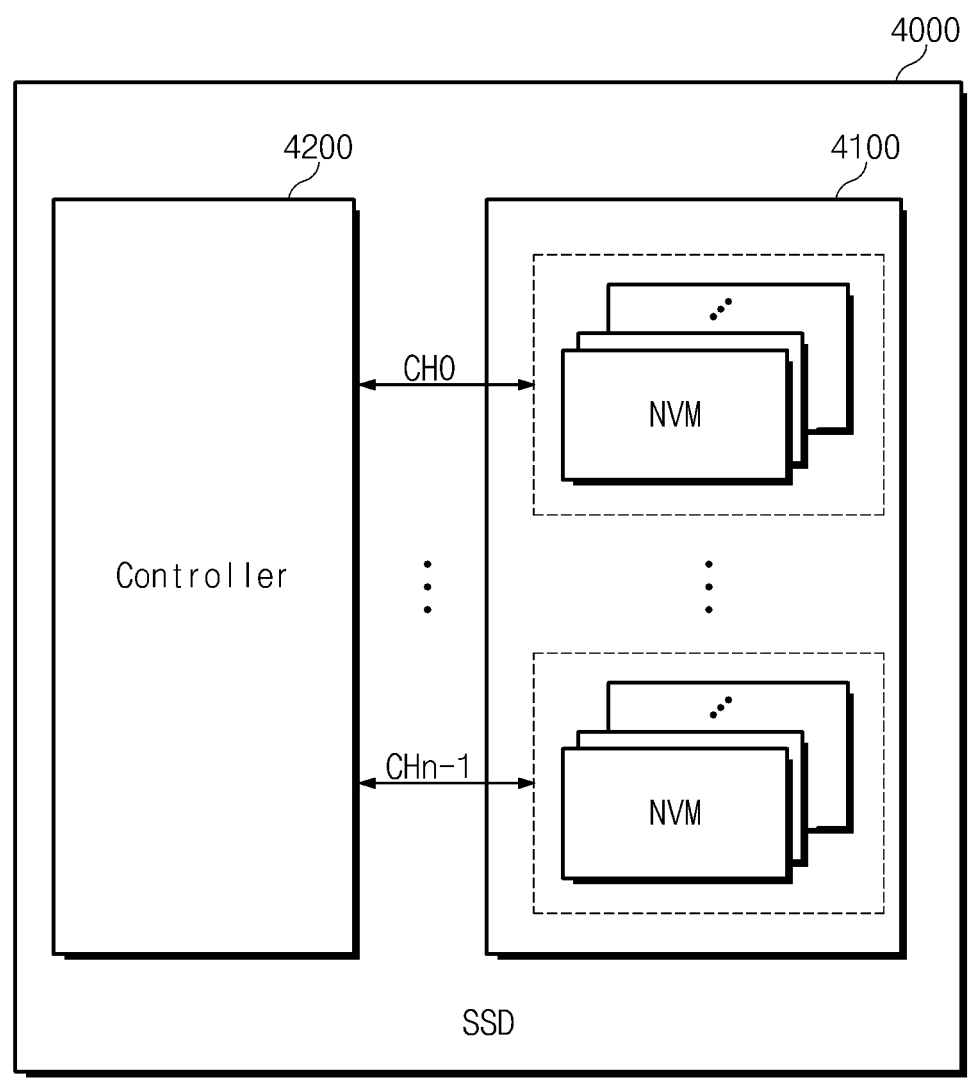
FIG. 15 is a block diagram showing a solid state drive according to an embodiment of the inventive concept.

FIG. 15 is a block diagram illustrating a solid state drive (SSD) 4000 according to an embodiment of the inventive concept.

Referring to FIG. 15, the solid state drive (SSD) 4000 may include a storage medium 4100 and a controller 4200. The storage medium 4100 may be connected with the controller 4200 via a plurality of channels, each of which is connected in common to a plurality of nonvolatile memories of the storage medium 4100. The controller 4200 and each nonvolatile memory may be configured substantially the same as illustrated in FIG. 2. That is, the controller 4200 may select one of a plurality of main program manners to control a main program operation of each nonvolatile memory according to the selected main program manner. Further, each nonvolatile memory may include a page buffer circuit which is configured to be set up with data stored at a second memory area as well as a first memory area.

Figure 16:
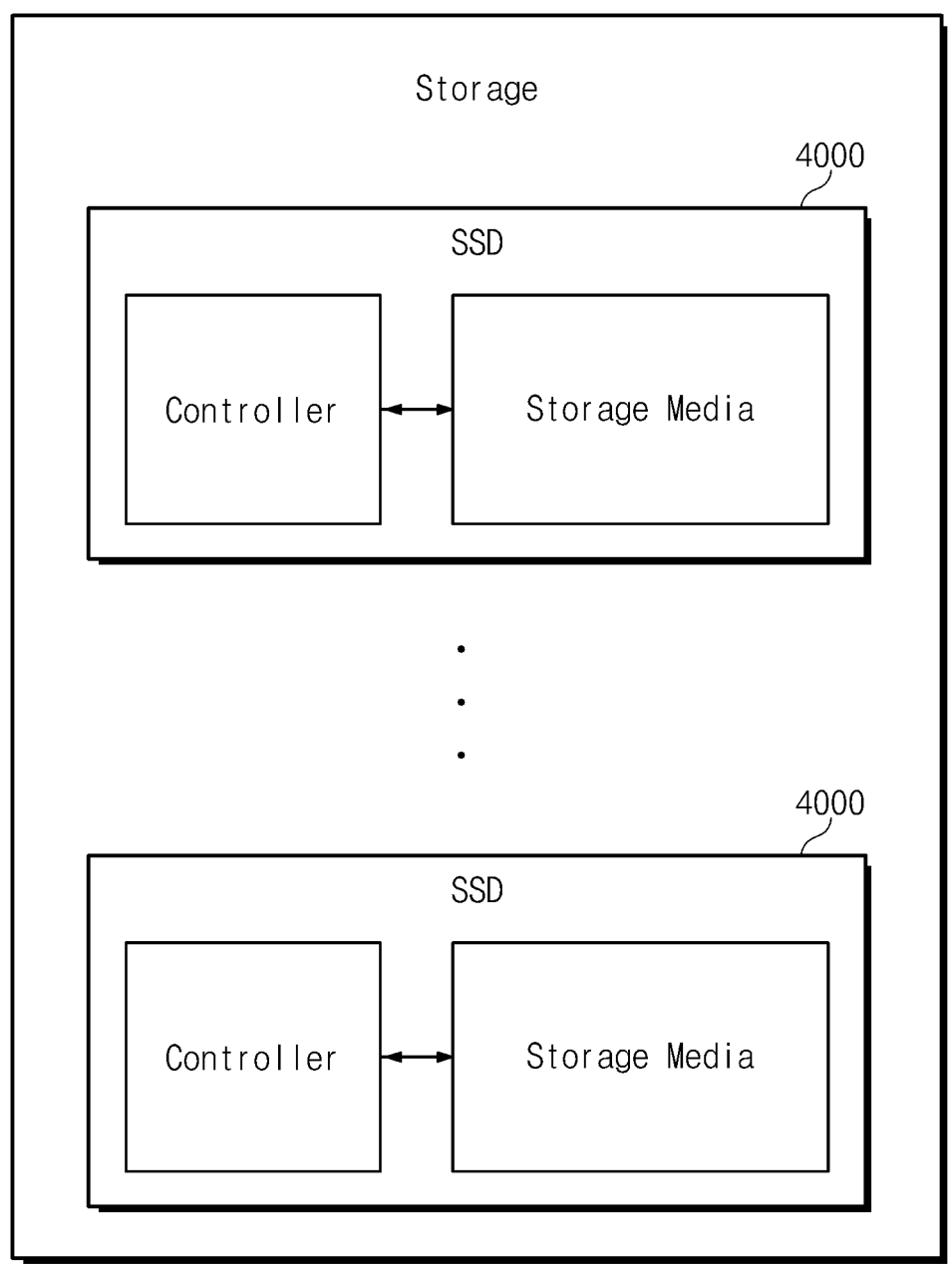
FIG. 16 is a block diagram showing a storage using the solid state drive of FIG. 15.
Figure 17:
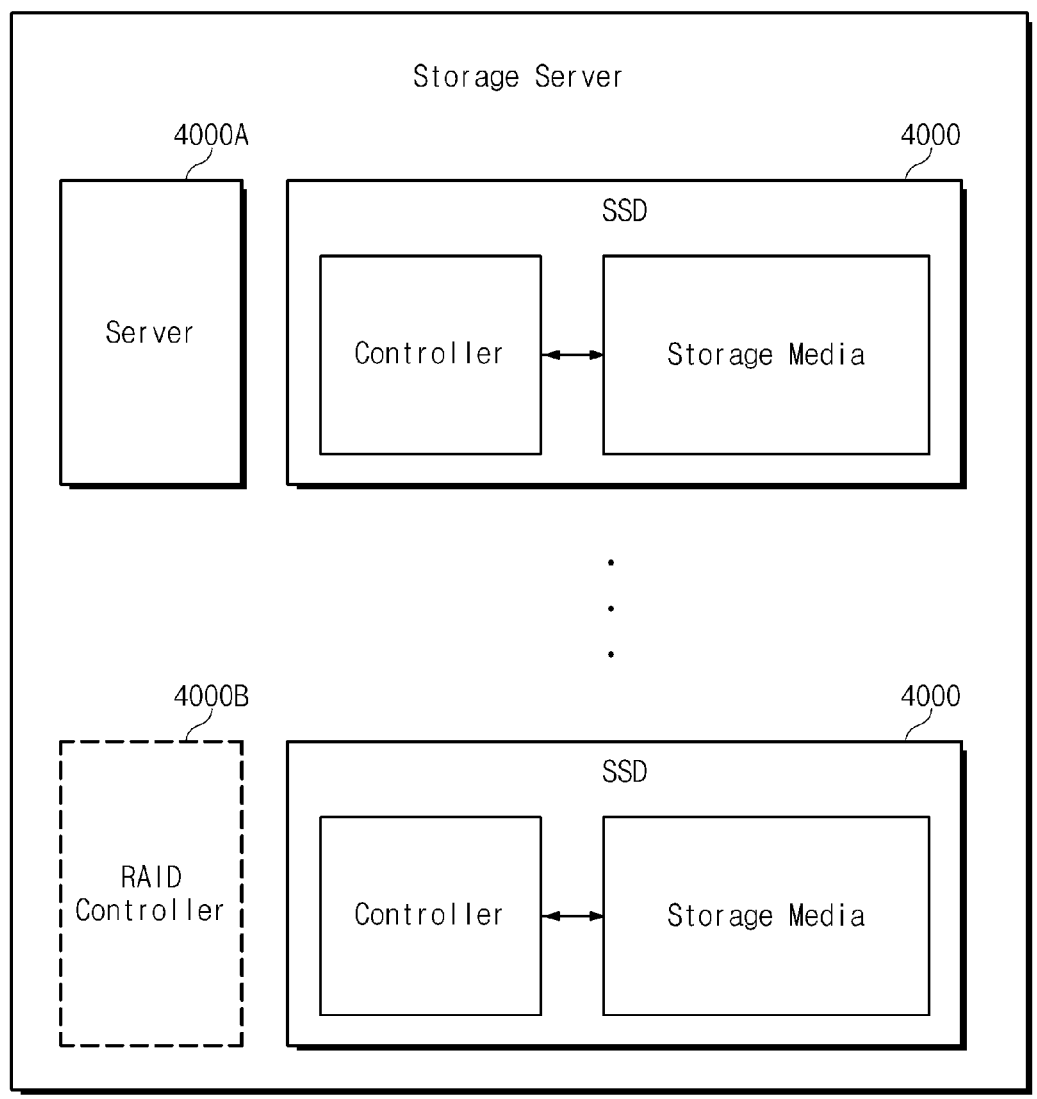
FIG. 17 is a block diagram showing a storage server using the solid state drive of FIG. 15.

FIG. 16 is a block diagram illustrating a storage usable with the solid state drive 4000 of FIG. 15, and FIG. 17 is a block diagram illustrating a storage server usable with the solid state drive 4000 of FIG. 15.

An SSD according to an embodiment of the inventive concept may be used to form the storage of FIG. 16. As illustrated in FIG. 16, the storage may include a plurality of solid state drives 4000 which are configured substantially the same as described in FIG. 15. An SSD according to an embodiment of the inventive concept is used to configure the storage sever of FIG. 17. As illustrated in FIG. 17, the storage server includes a plurality of solid state drives 4000 which are configured substantially the same as described in FIG. 15, and a server 4000A. Further, it is well comprehended that a redundant array of independent disks (RAID) controller 4000B is provided in the storage server.

Figure 18:
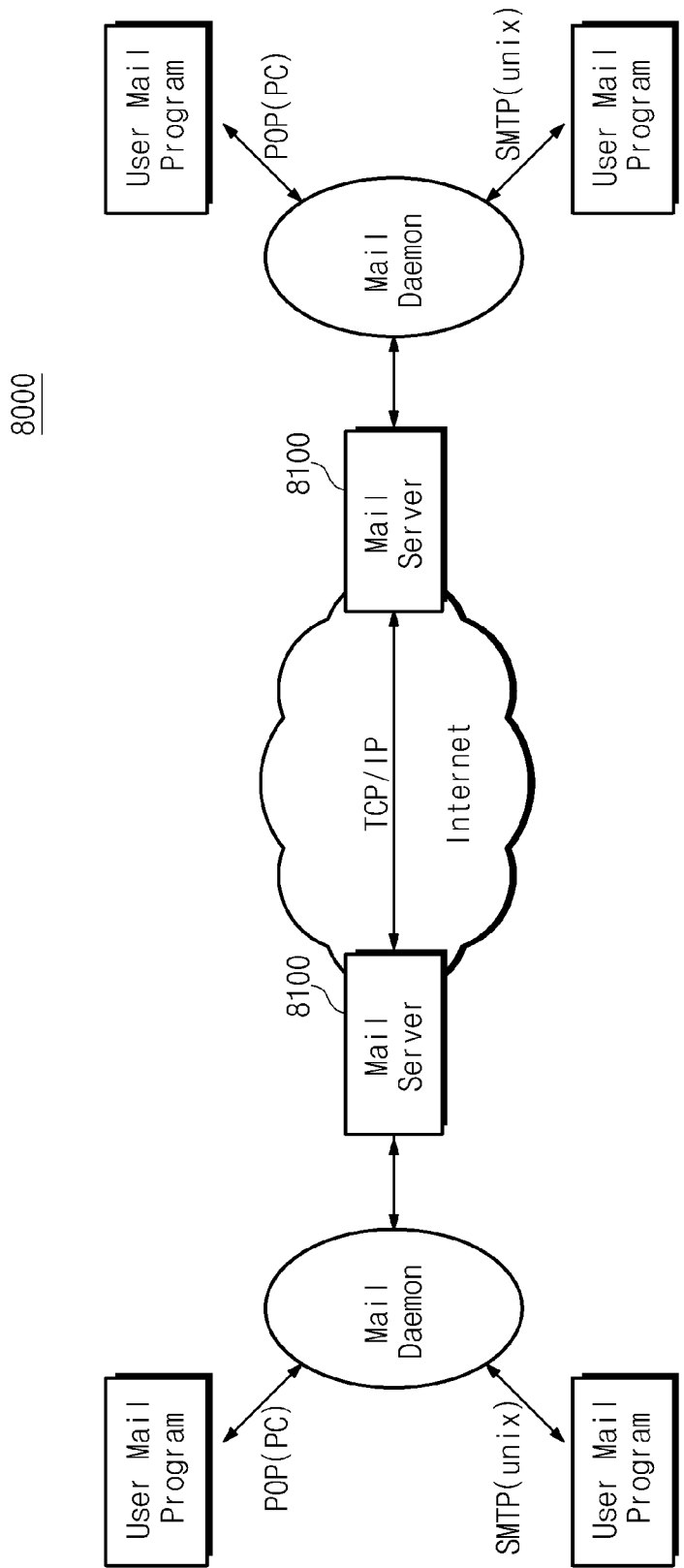
FIG. 18 is a diagram schematically illustrating a system usable with a data storage device according to an embodiment of the inventive concept.

FIG. 18 is a diagram schematically illustrating a system usable with a data storage device according to an embodiment of the inventive concept.

As illustrated in FIG. 18, a solid state drive including a data storage device according to an embodiment of the inventive concept may be applied to a mail server 8100. The main server 8100 may communicate with a mail daemon to perform a user mail program according to a protocol, for example, a post-office protocol (POP) for a personal computer and a simple mail transfer protocol (SMPT) for a Unix system.

Figure 19:
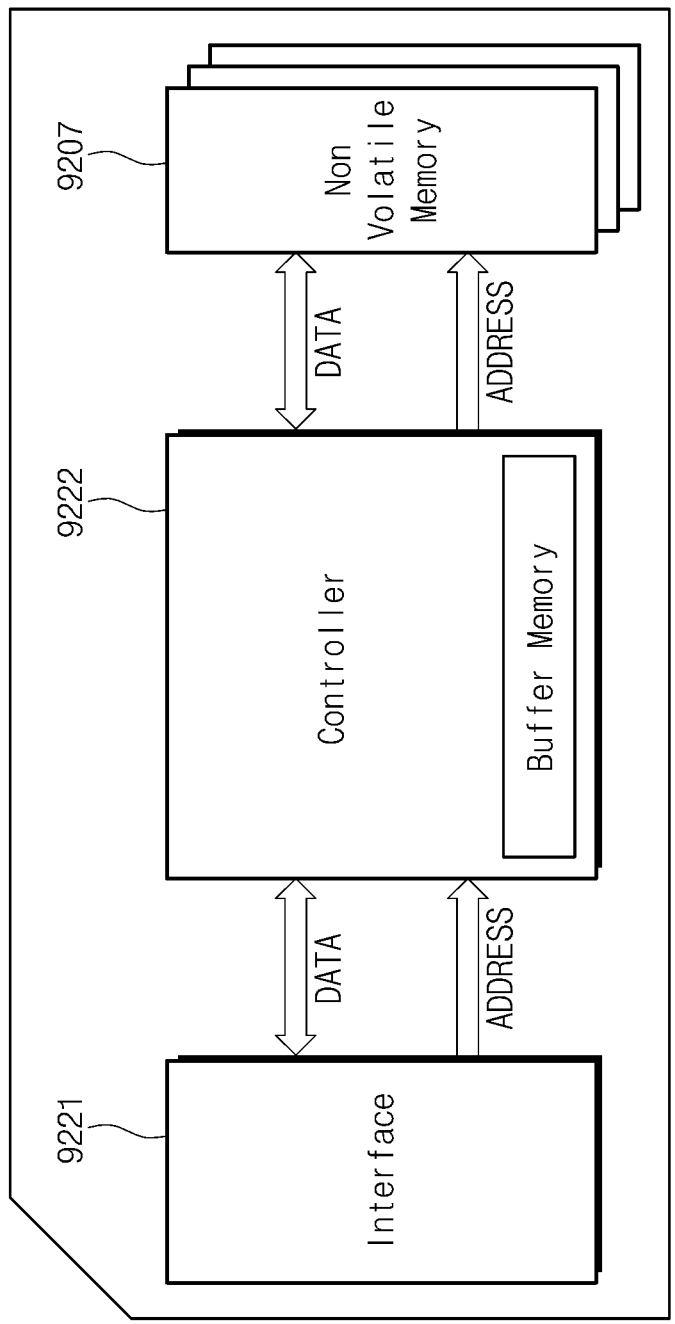
FIG. 19 is a block diagram illustrating a memory card according to an embodiment of the inventive concept.

FIG. 19 is a block diagram illustrating a memory card according to an embodiment of the inventive concept.

The memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 19, the memory card may include an interface circuit 9221 to interface with an external device, a controller 9222 including a buffer memory to control an operation of the memory card, and at least one nonvolatile memory device 9207. The controller 9222 may be a processor which is configured to control write and read operations of the non-volatile memory device 9207. The controller 9222 may be coupled with the non-volatile memory device 9207 and the interface circuit 2221 via a data bus and an address bus. The controller 9222 and the non-volatile memory device 9207 may correspond to a memory controller and a nonvolatile memory device described in FIG. 2, respectively. That is, the controller 9222 may select one of a plurality of main program manners to control a main program operation of the nonvolatile memory device 9207 according to the selected main program manner. Further, the nonvolatile memory device 9207 may include a page buffer circuit which is configured to be set up with data stored at a second memory area as well as a first memory area.

Figure 20:
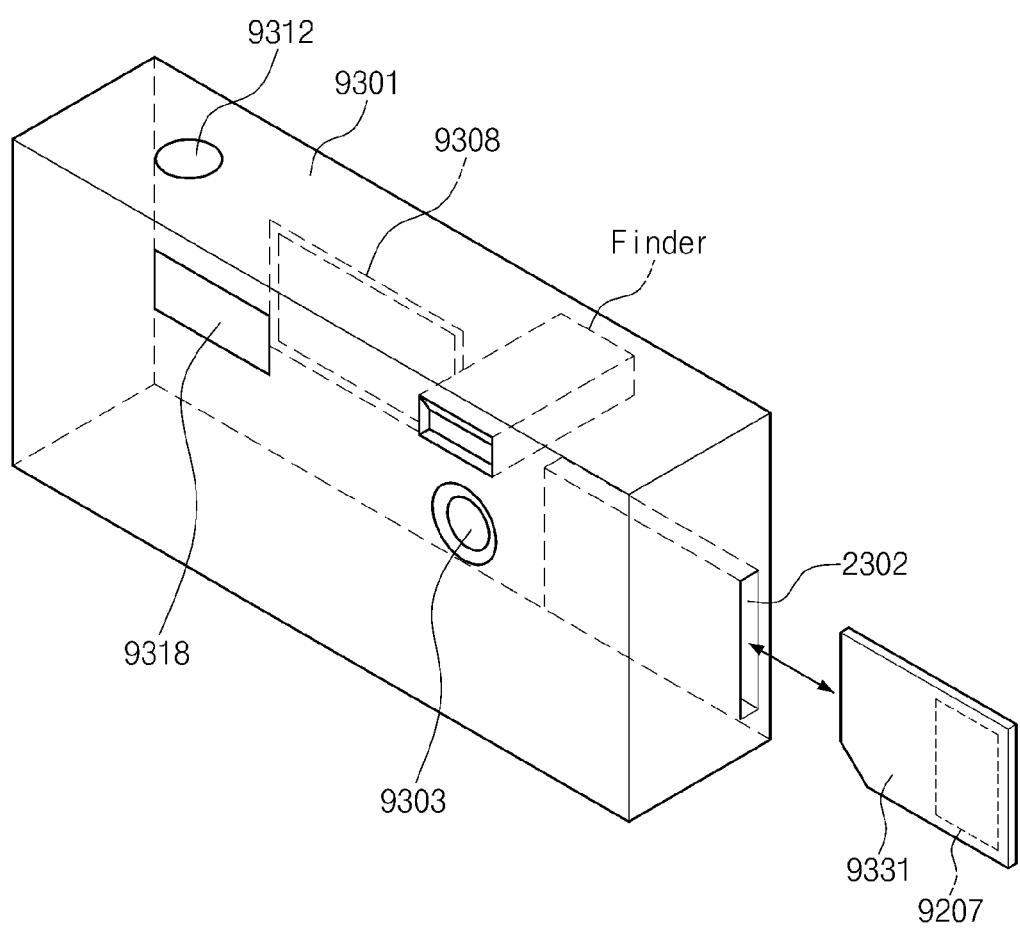
FIG. 20 is a block diagram schematically illustrating an electronic apparatus, for example, a digital still camera, according to an embodiment of the inventive concept.

FIG. 20 is a block diagram schematically illustrating an electronic apparatus, such as a digital still camera, according to an exemplary embodiment of the inventive concept.

Referring to FIG. 20, the digital still camera may include a body 9301, a connecting unit having a slot 2302 with connection terminals, a lens 9303, a display circuit 9308, a shutter button 9312, a strobe 9318, and the like. A memory card 9331 having connection terminal is inserted in the slot 9308 such that the terminals of memory card 9331 are electrically connected to the corresponding terminals of the slot 9308. The memory card 9331 may include the memory controller 1200 and the nonvolatile memory device 1400 described in FIG. 2. That is, the memory controller 1200 may select one of a plurality of main program manners to control a main program operation of the nonvolatile memory device 1400 according to the selected main program manner. Further, the nonvolatile memory device 1400 may include a page buffer circuit which is configured to be set up with data stored at a second memory area as well as a first memory area.

If the memory card 9331 has a contact type, an electric circuit on a circuit board is electrically contacted with the memory card 9331 when it is inserted in the slot 9308. In the event that the memory card 9331 has a non-contact type, an electric circuit on a circuit board communicates with the memory card 9331 in a radio-frequency manner.

Figure 21:
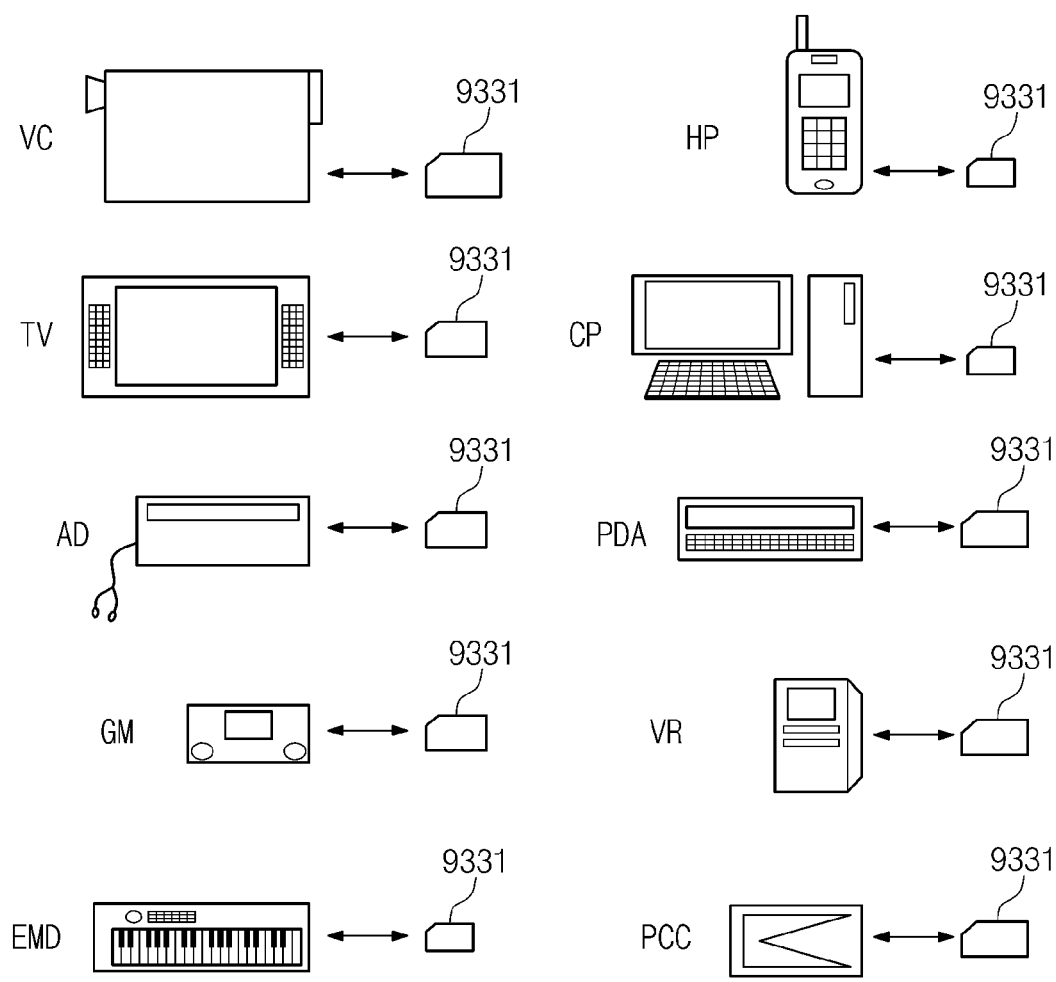
FIG. 21 is a diagram illustrating various systems usable with the memory card of FIG. 19.

FIG. 21 is a diagram illustrating various systems usable with the memory card of FIG. 19 according to an exemplary embodiment of the present general inventive concept.

Referring to FIG. 21, the memory card of FIG. 19 or the memory card 9331 of FIG. 20 may be applied to a video camera VC, a television TV, an audio device AD, a game machine GM, an electronic music device EMD, a cellular phone HP, a computer CP, a Personal Digital Assistant PDA, a voice recorder VR, a PC card PCC, and the like.

In an exemplary embodiment, memory cells can be formed of a variable resistance memory cell. An exemplary variable resistance memory cell and a memory device including the same are disclosed in U.S. Pat. No. 7,529,124, the entirety of which is incorporated by reference herein.

In other example embodiments of the inventive concept, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

A memory device having a charge trap flash structure as a charge storage layer is disclosed in U.S. Pat. No. 6,858,906 and U.S. Patent Application Publication Nos. 2004/0169238 and 2006/0180851, the entirety of which is incorporated by reference herein. A source-drain free flash structure is KR Patent No. 673020, the entirety of which is incorporated by reference herein.

A nonvolatile memory device and/or a memory controller according to the inventive concept may be packed using various types of packages. For example, A non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A memory system comprising:
a nonvolatile memory device having a first data area to store M-bit data using a buffer program operation and a second data area to store N-bit data using a main program operation where M and N are integers and N is greater than M; and
a memory controller configured to control the nonvolatile memory device,
wherein, in response to determining that the main program operation requires uses of data stored at the first and second data areas, the memory controller calculates values indicating a performance of the main program operation to be executed according to a plurality of main program schemes, selects one of the plurality of main program schemes based on the calculated values, and controls the nonvolatile memory device to perform the main program operation according to the selected main program scheme,
wherein the plurality of main program schemes includes a first main program scheme and a second main program scheme,
wherein the main program operation is performed based on X-page data stored at the first data area and Y-page data stored at the second data area where X and Y are integers,
wherein the main program operation according to the first main program scheme includes operations of reading 1-page data of the Y-page data from the second data area via a page buffer circuit of the nonvolatile memory device, performing an error correcting operation on the read 1-page data, storing the error-corrected page data at the first data area, reading the X-page data and the error-corrected page data from the first data area, and setting up the page buffer circuit with the read X-page data, wherein the reading 1-page data of the Y-page data, the performing an error correcting operation, and storing the error-corrected page data are iterated until each page of the Y-page data is read, and
wherein the main program operation according to the second main program scheme includes operations of reading 1-page data of the Y-page data from the second data area via a page buffer circuit of the nonvolatile memory device, performing an error correcting operation on the read 1-page data, and setting up the page buffer circuit with the error-corrected page data and 2-page data read from the first data area, and wherein the reading 1-page data, performing an error correcting operation, and setting up the page buffer circuit are iterated until each page of the Y-page data is read.

2. The memory system of claim 1, wherein the value indicating the performance of the main program operation includes a time taken to perform the main program operation, a power consumed to perform the main program operation, or a data transfer number between the nonvolatile memory device and the memory controller when the main program operation is performed.

3. The memory system of claim 1, wherein 1-bit data is programmed at the first data area according to a single-bit program scheme and 3-bit data is programmed at the second data area according to a multi-bit program scheme.

4. The memory system of claim 1, wherein data set up at the page buffer circuit is programmed at the second data area according to a 3-step reprogramming scheme.

5. The memory system of claim 1, wherein, in response to the main program operation using data stored at the first data area being required, the memory controller controls the nonvolatile memory device to perform the main program operation according to a third main program scheme different from the first and second main program schemes.

6. The memory system of claim 5, wherein the main program operation according to the third main program scheme includes operations of setting up the page buffer circuit with plural pages of data sequentially read out from the first data area and programming the setup data at the second data area according to a 3-step reprogramming scheme.

7. An operating method of a memory system which includes a nonvolatile memory device having a first data area storing M-bit data using a buffer program operation and a second data area storing N-bit data using a main program operation where M and N are integers and N is greater than M; and a memory controller configured to control the nonvolatile memory device, the operating method comprising:
  determining whether a main program operation requires uses of data stored at the first and data stored at the second data area;
  in response to determining that the main program operation requires uses of data stored at the first and data stored at the second data area, calculating values indicating a performance of the main program operation to be executed according to a plurality of main program schemes;
  selecting one of the plurality of main program schemes based on the calculated values; and
  controlling the nonvolatile memory device to perform the main program operation according to the selected main program scheme,
  wherein the plurality of main program schemes includes a first main program scheme and a second main program scheme,
  wherein the main program operation is performed based on X-page data stored at the first data area and Y-page data stored at the second data area where X and Y are integers,
  wherein the main program operation according to the first main program scheme includes operations of reading 1-page data of the Y-page data from the second data area via a page buffer circuit of the nonvolatile memory device, performing an error correcting operation on the read 1-page data, storing the error-corrected page data at the first data area, reading the X-page data and the error-corrected page data from the first data area, and setting up the page buffer circuit with the read X-page data, wherein the reading 1-page data of the Y-page data, the performing an error correcting operation, and storing the error-corrected page data are iterated until each page of the Y-page data is read, and
  wherein the main program operation according to the second main program scheme includes operations of reading 1-page data of the Y-page data from the second data area via a page buffer circuit of the nonvolatile memory device, performing an error correcting operation on the read 1-page data, and setting up the page buffer circuit with the error-corrected page data and 2-page data read from the first data area, wherein the reading 1-page data, performing an error correcting operation, and setting up the page buffer circuit are iterated until each page of the Y-page data is read.

8. The operating method of claim 7, wherein 1-bit data is programmed at the first data area according to a single-bit program scheme and 3-bit data is programmed at the second data area according to a multi-bit program scheme.

9. The operating method of claim 7, wherein data set up at the page buffer circuit is programmed at the second data area according to a 3-step reprogramming scheme.

10. A non-transitory computer-readable medium to contain computer-readable medium to execute the method of claim 7.

11. A memory system comprising:
  a nonvolatile memory device having a plurality of data areas to store different-bit data; and
  a memory controller to select one of a plurality of program schemes according to comparison between the program schemes to be suitable to perform a main program using data stored in at least two of the plurality of data areas of the nonvolatile memory device, and to perform the main program operation according to the selected program scheme using data stored at the at least two of the plurality of data areas,
  wherein the plurality of main program schemes includes a first main program scheme and a second main program scheme,
  wherein the selected main program operation is performed based on X-page data stored at the first data area and Y-page data stored at the second data area where X and Y are integers,
  wherein the first main program scheme includes operations of reading 1-page data of the Y-page data from the second data area via a page buffer circuit of the nonvolatile memory device, performing an error correcting operation on the read 1-page data, storing the error-corrected page data at the first data area, reading the X-page data and the error-corrected page data from the first data area, and setting up the page buffer circuit with the read X-page data; and wherein the reading 1-page data of the Y-page data, the performing an error correcting operation, and storing the error-corrected page data are iterated until each page of the Y-page data is read, and
  wherein the second main program scheme includes operations of reading 1-page data of the Y-page data from the second data area via a page buffer circuit of the nonvolatile memory device, performing an error correcting operation on the read 1-page data, and setting up the page buffer circuit with the error-corrected page data and 2-page data read from the first data area; and wherein the reading 1-page data, performing an error correcting operation, and setting up the page buffer circuit are iterated until each page of the Y-page data is read.

12. The memory system of claim 11, wherein the memory controller compares characteristics of the different-bit data and selects the program scheme based on the comparison result.

13. The memory system of claim 11, wherein the memory controller compares characteristics of the plurality of program schemes with respect to characteristics of the different-bit data.

14. A computing system comprising:
  an interface to communicate with an external device to receive and transmit data;
  a storage having the memory system of claim 11; and
  a controller to control the interface and the storage to process the data.

* * * * *